United States Patent [19]

Tomomatsu et al.

[11] Patent Number: 5,729,032
[45] Date of Patent: Mar. 17, 1998

[54] FIELD EFFECT TYPE SEMICONDUCTOR DEVICE AND MANUFACTURING METHOD THEREOF

[75] Inventors: Yoshifumi Tomomatsu; Youichi Ishimura, both of Fukuoka, Japan

[73] Assignee: Mitsubishi Denki Kabushiki Kaisha, Tokyo, Japan

[21] Appl. No.: 386,059

[22] Filed: Feb. 7, 1995

[30] Foreign Application Priority Data

Feb. 28, 1994 [JP] Japan .................................. 6-029516

[51] Int. Cl.⁶ .................................................. H01L 29/74
[52] U.S. Cl. .......................... 257/139; 257/173; 257/174; 257/355; 257/360; 257/391
[58] Field of Search .............................. 257/173, 174, 257/355, 360, 139

[56] References Cited

U.S. PATENT DOCUMENTS 4,893,158  1/1990  Mihara et al. ............................ 257/341

*Primary Examiner*—Edward Wojciechowicz
*Attorney, Agent, or Firm*—Oblon, Spivak, McClelland, Maier & Neustadt, P.C.

[57] ABSTRACT

It is an abject to stably and surely perform protection operation of devices. Since the gate threshold voltage $V_{GE(th)S}$ in a sense IGBT cell constituting a sensing circuit is set to have a higher value than the gate threshold voltage $V_{GE(th)M}$ in a main IGBT cell constituting a main circuit, a finite time $\Delta t$ is required from when the gate voltage $V_{GE}$ reaches the gate threshold voltage $V_{GE(th)M}$ until when it reaches the gate threshold voltage $V_{GE(th)S}$ in the turn-on period. Accordingly, the rise of the main current Is of the sensing circuit is delayed from the main current Im of the main circuit. As a result, surge current does not appear in the current Is. As the surge current does not appear in the main current of the sensing circuit, a protection circuit of the device operates stably, and breakdown of the device is surely prevented.

10 Claims, 43 Drawing Sheets

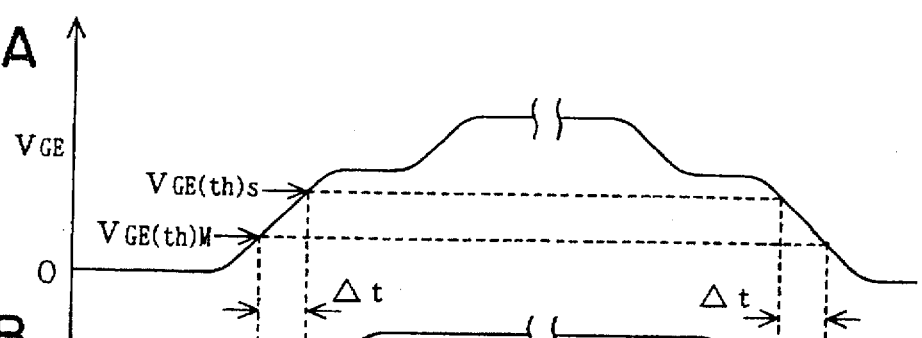
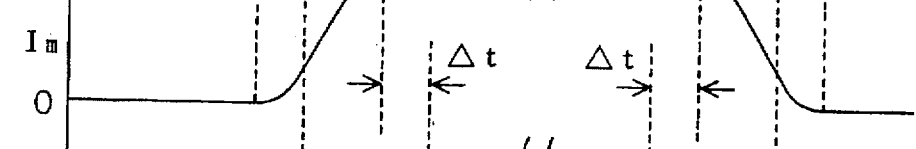

FIG. 2A
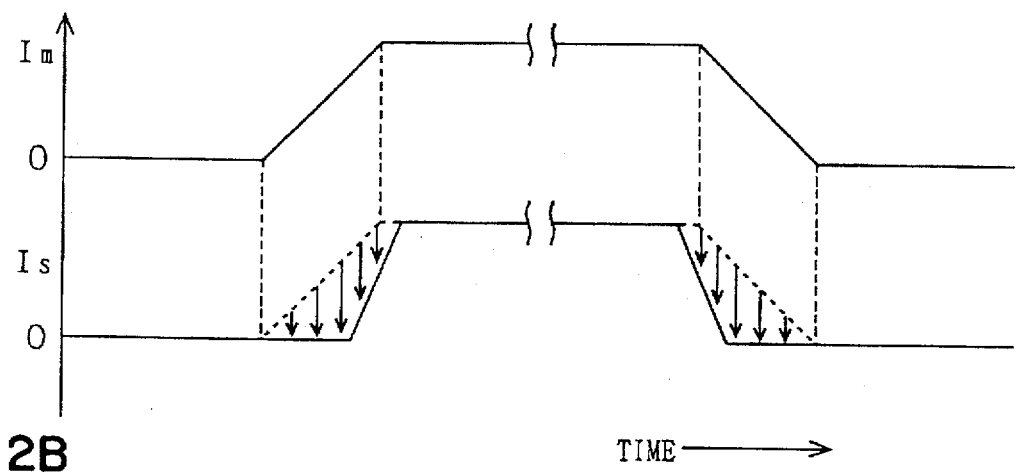
FIG. 2B
FIG. 3A
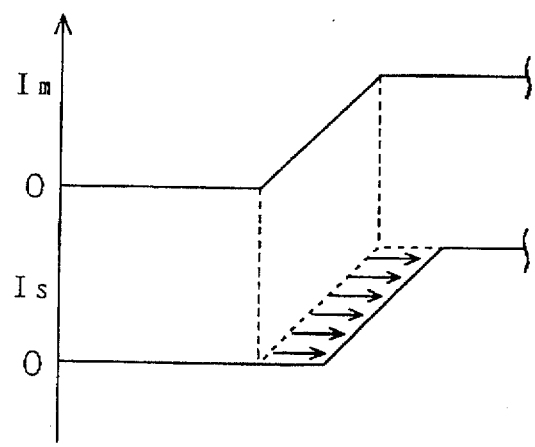
FIG. 3B

F I G. 1 1
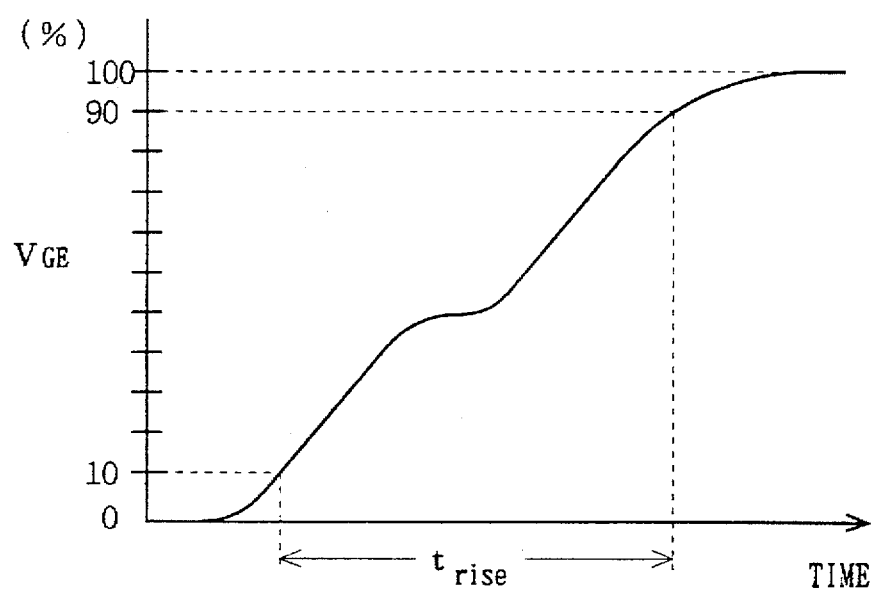

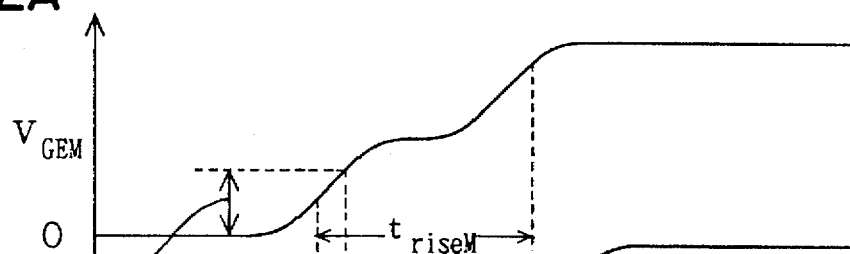
F I G. 12A
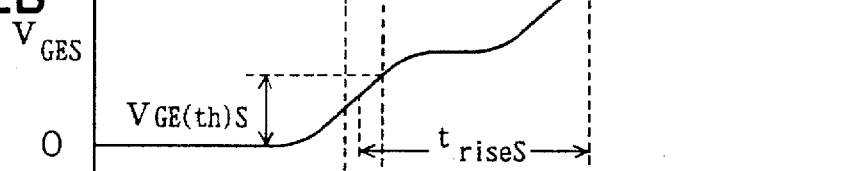
F I G. 12B
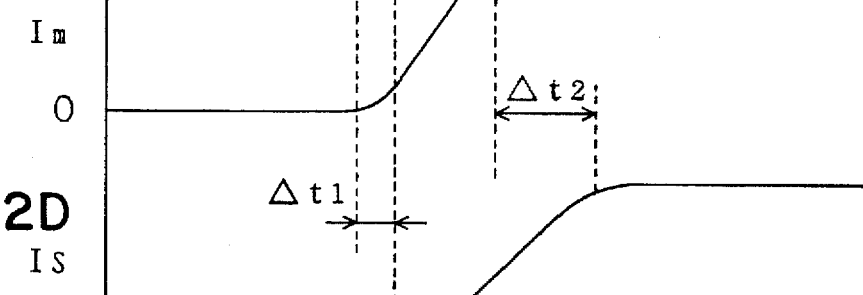
F I G. 12C
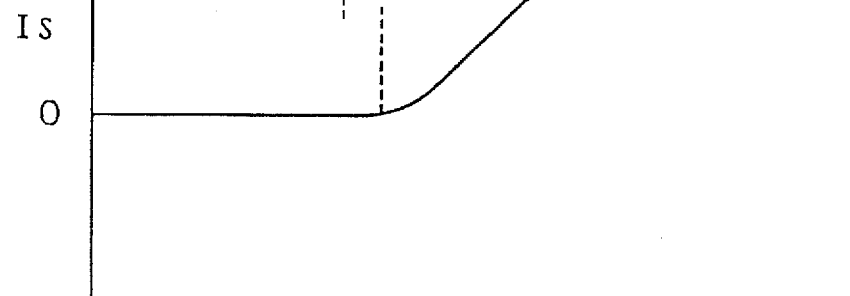
F I G. 12D

FIG. 44
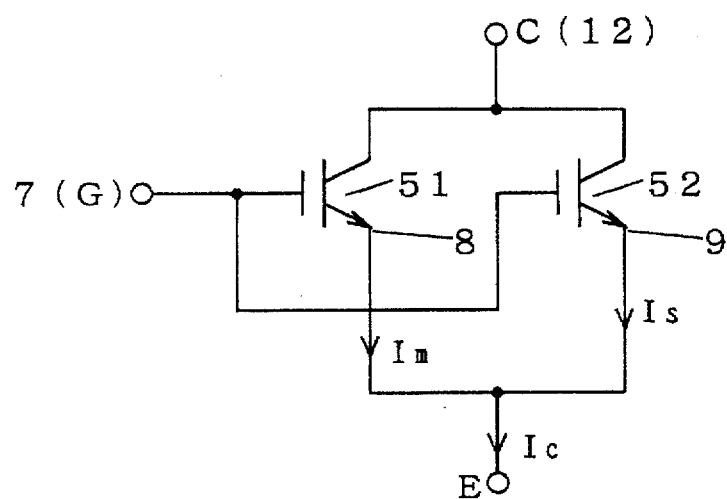
FIG. 45A
FIG. 45B
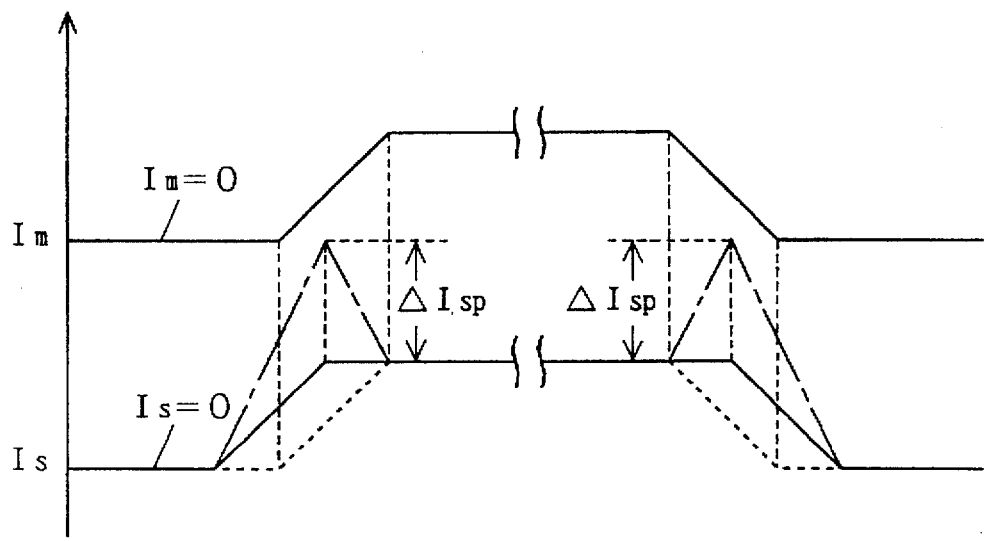

FIELD EFFECT TYPE SEMICONDUCTOR DEVICE AND MANUFACTURING METHOD THEREOF

BACKGROUND OF THE INVENTION

1. Field of the Invention

The present invention relates to field effect type semiconductor devices incorporating sensing circuits, and particularly to an improvement for suppressing the surge current occurring in the turn-on period in the sensing circuit.

2. Description of the Background Art

The field effect type semiconductor devices are semiconductor devices having gate electrodes for applying electric field to semiconductor layers together with main electrodes for supplying main current to the semiconductor layers in which the main current is controlled by the voltage applied to the gate electrodes. Typical examples thereof include the MOS transistors and the insulated gate bipolar transistors (simply referred to as IGBT, hereinafter). Particularly, field effect type semiconductor devices for electric power generally have structures in which a large number of elements (referred to as unit cells, hereinafter) are connected in parallel.

In such field effect type semiconductor devices having a large number of unit cells, devices are known which have sensing circuits comprised of part of the unit cells for detecting the main current to prevent breakdown of the devices due to overcurrent. A conventional device incorporating such a sensing circuit will now be described below.

<Structure of the Conventional Device>

FIG. 41 is a fragmentary front section view of an IGBT incorporating a conventional sensing circuit (simply referred to as CS-IGBT, hereinafter). FIG. 41 shows a portion in which one of IGBT unit cells 51 constituting a main circuit (simply referred to as a main IGBT cell, hereinafter) and an IGBT unit cell 52 constituting a sensing circuit (simply referred to as a sense IGBT cell, hereinafter) are formed adjacent to each other. The main IGBT cell 51 and the sense IGBT cell 52 have the same structure.

In this CS-IGBT 50, an n semiconductor layer 2 containing n-type impurity is formed by the epitaxial growth on a semiconductor substrate constituting a p collector layer 1 containing p-type impurity. The p collector layer 1 and the n semiconductor layer 2 form a semiconductor body 40 like a flat board. On the upper main surface of the semiconductor body 40, that is, on the upper surface of the n semiconductor layer 2, p base layers 3 are selectively formed by selectively diffusing the p-type impurity.

Furthermore, on the upper surfaces of the p base layers 3, $p^+$ semiconductor layers 11 are selectively formed by selectively introducing the p-type impurity with a high concentration. Furthermore, on the upper surfaces of the p base layers 3 and the $p^+$ semiconductor layers 11, n emitter layers 5 are selectively formed by selectively diffusing the n-type impurity. The $p^+$ semiconductor layer 11 is formed inside the p base layer 3 surrounding the n emitter layer 5. A gate electrode 7 is provided above the upper surface of the p base layers 3 interposed between the n semiconductor layer 2 and the n emitter layer 5, i.e., above channel regions 21 with a gate insulating film 6 interposed therebetween. The gate insulating film 6 and the gate electrode 7 are formed on the upper main surface of the semiconductor body 40 to be integral between adjacent IGBT unit cells. Above the upper main surface of the semiconductor body 40, emitter electrodes 8 and 9 are further formed to be electrically connected to both the n emitter layers 5 and the $p^+$ semiconductor layers 11. The gate electrode 7 and the emitter electrodes 8, 9 are electrically insulated from each other by an interlayer insulating film 10 interposed therebetween.

The gate electrode 7 is electrically connected among all main IGBT cells 51 and sense IGBT cells 52. Also, the emitter electrode 8 is integrally formed through all the main IGBT cells 51. Furthermore, a collector electrode 12 is connected on the lower main surface of the semiconductor body 40, i.e., on the lower surface of the p collector layer 1. The collector electrode 12 is integrally formed through all the main IGBT cells 51 and sense IGBT cells 52.

The number of the main IGBT cells 51 in the entire device is larger by far than that of the sense IGBT cells 52. Accordingly, the channel width (Wm) of the main IGBT cells 51 is sufficiently larger as compared with the channel width (Ws) of the sense IGBT cells 52 through the entire CS-IGBT 50. That is to say, the CS-IGBT 50 is constituted so that Wm>Ws.

The emitter electrode 9 of the sense IGBT cell 52 is specifically referred to as a "sensing electrode" and main current flowing through the sense IGBT cell 52 is specifically referred to as a "sensing current" as needed, hereinafter. Also, the emitter electrode of the main IGBT cell 51 is specifically referred to as a "main circuit emitter electrode" and main current flowing through the main IGBT cell 51 is specifically referred to as a "main circuit current".

<Normal Operation of Conventional Device>

Next, the normal operation of the CS-IGBT 50 will be described. As the main IGBT cell 51 and the sense IGBT cell 52 have the same structure, operations thereof are also common to each other.

When using the CS-IGBT 50, first, the external power source is connected to apply a positive collector voltage $V_{CE}$ between the collector electrode 12 and the emitter electrodes 8, 9. In this condition, a positive gate voltage $V_{GE}$ exceeding a predetermined gate threshold voltage $V_{GE(th)}$ is applied between the gate electrode 7 and the emitter electrodes 8, 9 (that is, the gate is turned on), and then the p-type channel region 21 is inverted into the n-type to form an n-type channel in the channel region 21.

As a result, electrons are injected into the n semiconductor layer 2 from the emitter electrodes 8, 9 via the n emitter layers 5. These injected electrons bias the p collector layer 1 and the n semiconductor layer 2 in the forward direction and then holes are injected from the p collector layer 1 to the n semiconductor layer 2. As a result, the resistance of the n semiconductor layer 2 largely decreases and then large collector current (main current) flows from the collector electrode 12 to the emitter electrodes 8, 9. That is to say, the CS-IGBT 50 goes into the conductive state.

Next, the gate voltage $V_{GE}$ is returned to zero or a minus (reverse bias) value (i.e., the gate is turned off), and then the channel formed in the channel region 21 disappears and the channel region 21 returns to the original p-type conductive form. As a result, the injection of electrons from the emitter electrodes 8, 9 is stopped, and then the injection of holes from the p collector layer 1 is also stopped. Subsequently, the electrons and holes remaining in the n semiconductor layer 2 are recovered to the collector electrode 12 and the emitter electrodes 8, 9, respectively, or are bonded with each other again. That is, the CS-IGBT 50 goes into the cut-off state.

<Overcurrent Protection Operation of the Conventional Device>

FIG. 42 is a circuit diagram showing the CS-IGBT 50 and an external circuit connected thereto. The operation of the CS-IGBT 50 will be further described referring to FIG. 42. Connected to the emitter electrode 8 (E) is the negative potential side output of an external power source device and connected to the collector electrode 12 (C) is the positive potential side output of the external power source device with a load 61 interposed therebetween. Thus, the positive collector voltage $V_{CE}$ is applied between the collector electrode 12 and the emitter electrodes 8, 9 as described above.

To the gate electrode 7, a control output OUT of a control circuit 60 is connected. Thus, the gate voltage $V_{GE}$ is applied to the gate electrode 7 as stated above. The control circuit 60 supplies the gate voltage $V_{GE}$ to the gate electrode 7 to realize the conductive state and the cut-off state of the CS-IGBT 50.

A gate resistance Rg shown in FIG. 42 equivalently represents the electric resistance along the gate interconnection and the gate electrode 7 in the CS-IGBT 50. Also, two sensing resistances Rso, Rss are connected in series between the sensing electrode 9 and the emitter electrode 8. The sensing current of the sense IGBT cell 52 flows to these sensing resistances Rso and Rss. Voltage in proportion to the sensing current is produced in the sensing resistances Rso, Rss accordingly. Two inputs of the control circuit 60 are connected to these sensing resistances Rso, Rss, respectively.

The control circuit 60 detects the voltage produced in the sensing resistances Rso, Rss to accomplish the protection function of preventing an excessive main current flowing through the CS-IGBT 50. As described above, the main IGBT cell 51 and the sense IGBT cell 52 operate in the same way, so that the main current flowing through the emitter electrode 8 and the sensing current flowing through the sensing electrode 9 are in proportion to each other. Accordingly, voltages in proportion to the main current flowing through the emitter electrode 8 are produced in the sensing resistances Rso, Rss. That is to say, the control circuit 60 detects the voltages to indirectly detect the main current flowing through the emitter electrode 8.

The control circuit 60 is provided with two protection circuits, an overcurrent protection circuit and a short protection circuit (not shown), which control the gate voltage $V_{GE}$ on the basis of the voltages produced in the sensing resistance Rso and the sensing resistance Rss, respectively. Both of these protection circuits pull down the gate voltage $V_{GE}$ when the voltage detected by each exceeds a certain reference voltage to control the main current flowing through the CS-IGBT 50.

The reference voltage in the overcurrent protection circuit is typically set to 1.7 times the rated current of the device. The reference voltage in the short protection circuit is set higher than that in the overcurrent protection circuit, which is typically set to about 1.5 times. That is to say, the overcurrent protection circuit operates with input voltage lower than the short protection circuit, in other words, at a lower level of main current.

On the other hand, while the overcurrent protection circuit operates with occurrence of voltage for a period of about 10 μsec, the short protection circuit operates in a time of about 1–2 μsec. That is to say, the response from the voltage production to the start of operation is set faster in the short protection circuit. As a result, while the overcurrent protection circuit works to prevent excessive main current flowing in the normal operation, the short protection circuit works to prevent excessive main current due to occurrence of abnormal condition such as short circuit, i.e., short current flowing.

The CS-IGBT 50 has a problem that the surge current occurs in the sensing current in the period of transition from the cut-off state to the conductive state, that is, in the turn-on period. FIG. 43 is a timing chart for clearly illustrating this problem, which shows changes in time of the gate voltage $V_{GE}$, the main current Ic of the entire device, and the sensing current Is.

As shown in FIG. 43, the gate voltage $V_{GE}$ rises in the turn-on period Ton. The rate of the rising of the gate voltage $V_{GE}$ is once slowed down while it is rising due to the so-called Miller capacitance. The main current Ic and the sensing current Is both rise as the gate voltage $V_{GE}$ rises. That is to say, the CS-IGBT 50 moves to the conductive state. In this process, the surge current ΔIsp appears in the sensing current Is. Similar surge current ΔIsp is produced in the transition period in which the device changes from the conductive state to the cut-off state, i.e., in the turn-off period Toff.

When the surge current ΔIsp is superimposed on the sensing current Is, the voltage occurring in the sensing resistance Rss may exceed the reference voltage of the short protection circuit. At this time, the short protection circuit operates to force the CS-IGBT 50 to be cut off. That is to say, there is a problem that the short protection circuit unnecessarily operates due to the surge current ΔIsp. This problem is especially serious in the turn-on period Ton of changing to the conductive state in the point that the original change to the conductive state is interrupted.

To control the unnecessary operation, the reference voltage in the short protection circuit must be increased. If the reference voltage is increased, however, the sensitivity of the short protection circuit is decreased to cause another problem that the short protection circuit does not operate when it is to operate. If the sensitivity of the short protection circuit becomes dull, the operation point of the CS-IGBT 50 may exceed the so-called area of safe operation (ASO), and then the CS-IGBT 50 may result in breakdown. That is to say, the conventional CS-IGBT involves a problem that it is difficult to realize both the stable operation of the protection circuits and the prevention of breakdown of the device.

As to the cause of occurrence of the surge current ΔIsp, the inventor considered as follows on the basis of what are discussed about the surge current produced in a circuit including switching semiconductor devices equivalent to each other connected in parallel in "PCI-Proceedings" June 1986 p218–p234. For convenience in the description, as shown in the circuit diagram of FIG. 44, an imaginary device having structure in which one main IGBT cell 51 and one sense IGBT cell 52 are connected in parallel is considered.

In this device, it is assumed that the main IGBT cell 51 changes to the conductive state earlier than the sense IGBT cell 52 in the turn-on period due to deviations slightly existing in the characteristics of the main IGBT cell 51 and the sense IGBT cell 52. Then, the sensing current Is flowing through the sense IGBT cell 52 rises earlier than the main circuit current Im flowing through the main IGBT cell 51.

At this time, as suggested by the literature cited above, the sense IGBT cell 52 bears extra current as if the sensing current Is compensates for the delay in rise of the main circuit current Im. As a result, the surge current ΔIsp is superimposed on the sensing current Is.

On the other hand, in the turn-off period, a unit cell with current falling later is forced to bear the extra burden. FIG. 45 shows an example of the sensing current Is falling later than the main circuit current Im. At this time the surge current ΔIsp is superimposed on the sensing current Is.

Such phenomenon occurs in all the IGBT cells constituting the CS-IGBT 50. As has been stated above, the number of the main IGBT cells 51 is much larger as compared with the number of the sense IGBT cells 52. Accordingly, just a small difference in the changes of the main circuit current Im and the sensing current Is causes large surge current ΔIsp in the sensing current Is.

It is estimated that this causes the superimpose phenomenon of the surge current ΔIsp on the sensing current Is described using FIG. 43. That is to say, the surge current ΔIsp appears in the sensing current Is because of inevitable existence of slight deviations in structure between the main IGBT cell 51 and the sense IGBT cell 52. The structural deviations cause deviations in characteristics.

SUMMARY OF THE INVENTION

The present invention is directed to a field effect type semiconductor device having a first field effect type semiconductor element through which relatively large main current flows and a second field effect type semiconductor element through which relatively small main current flows formed in the same semiconductor body and connected to each other in parallel. According to the present invention, in the field effect type semiconductor device, structures of the first and second field effect type semiconductor elements differ from each other so that a rise of the main current of the second field effect type semiconductor element is delayed from a rise of the main current of the first field effect type semiconductor element when the device turns on.

According to the device of the present invention, since a rise of the main current is delayed in the second field effect type semiconductor element than in the first field effect type semiconductor element, surge current does not appear in the main current of the second field effect type semiconductor element.

Accordingly, when a protection circuit for protecting the device from breakdown due to the overcurrent is added by using the second field effect type semiconductor element as a sensing element for detecting the main current of the first field effect type semiconductor element, it has the effect of consistently realizing stable operation of the protection circuit and ensured prevention of breakdown of the device.

Preferably, in the field effect type semiconductor device according to the invention, gate threshold voltage of the second field effect type semiconductor element is set to be higher than gate threshold voltage of the first field effect type semiconductor element.

According to the device of the present invention, since the gate threshold voltage is set higher in the second field effect type semiconductor element than in the first field effect type semiconductor element, the rise of the main current is delayed in the second field effect type semiconductor element than in the first field effect type semiconductor element.

Accordingly, stable operation of the protection circuit and reliable prevention of breakdown of the device can be realized consistently.

Preferably, a rise time in the main current of the second field effect type semiconductor element is set to be larger than a rise time in the main current of the first field effect type semiconductor element.

According to the device of the present invention, since the rise time in the main current is set larger in the second field effect type semiconductor element than in the first field effect type semiconductor element, the rise of the main current is delayed in the second field effect type semiconductor element than in the first field effect type semiconductor element.

Accordingly, stable operation of the protection circuit and ensured prevention of breakdown of the device can be realized consistently.

Preferably, gate resistance of the second field effect type semiconductor element is set to be higher than gate resistance of the first field effect type semiconductor element to make the rise time larger in the second field effect type semiconductor element than in the first field effect type semiconductor element.

According to the device of the present invention, since the rise time is set by adjusting the gate resistance, the rise time can be set easily.

Preferably, gate input capacitance of the second field effect type semiconductor element is set to be larger than gate input capacitance of the first field effect type semiconductor element to make the rise time larger in the second field effect type semiconductor element than in the first field effect type semiconductor element.

According to the device of the present invention, since the rise time is set by adjusting the gate input capacitance, the rise time can be set easily.

Preferably, channel length of the second field effect type semiconductor element is set to be larger than channel length of the first field effect type semiconductor element to make the gate input capacitance larger in the second field effect type semiconductor element than in the first field effect type semiconductor element.

According to the device of the present invention, since the gate input capacitance is set by adjusting the channel length, the gate input capacitance can be set easily.

Preferably, at least part of a gate insulating film of the first field effect type semiconductor element is thicker than a gate insulating film of the second field effect type semiconductor element to make the gate input capacitance larger in the second field effect type semiconductor element than in the first field effect type semiconductor element.

According to the device of the present invention, since the gate input capacitance is set by making a thickness of the gate insulating film different at least in a part, the gate input capacitance can be set easily.

The present invention is also directed to a method of manufacturing a field effect type semiconductor device including the following steps (a) to (p). According to the present invention, the manufacturing method comprises the steps of: (a) obtaining a semiconductor body having a first semiconductor layer of a first conductivity type with the first semiconductor layer exposed in an upper main surface; (b) forming an oxide film on the upper main surface of the semiconductor body; (c) forming a conductive layer on the oxide film; (d) forming a gate electrode layer having a plurality of first openings by selectively removing the conductive layer; (e) selectively introducing impurity of a second conductivity type in the upper main surface of the semiconductor body through the plurality of first openings by using the gate electrode as a mask to selectively form a plurality of second semiconductor layers of the Second conductivity type on an upper surface portion of the first semiconductor layer; (f) forming a shield film covering all the first openings except at least one of the plurality of first openings; (g) selectively introducing impurity of the second conductivity type in the upper main surface of the semiconductor body by using the gate electrode and the shield film as masks to enhance impurity concentration in at least one of the plurality of second semiconductor layers; (h) removing the shield film after the step (g); (i) diffusing the impurity introduced in the steps (e) and (g) into the first semiconductor layer to spread the second semiconductor layers to right under the gate electrode layer; (j) selectively removing the oxide film existing in each of the plurality of first openings except a center region of each first opening; (k) selectively introducing impurity of the first conductivity type in the upper main surface of the semiconductor body by using the oxide film remaining in the center regions and the gate electrode as masks to form third semiconductor layers of the first conductivity type in the upper surface portion of the second semiconductor layers; (l) removing the oxide film remaining in the center regions; (m) forming an insulating film having second openings which open inside the first openings with their opening ends located outside the center regions and covering side surfaces and an upper surface of the gate electrode layer; (n) forming a first main electrode layer so as to be electrically connected to the upper main surface of the semiconductor body exposed in the second openings; (o) separating the first main electrode layer into a portion connected to the upper main surface of the semiconductor body in the at least one first opening selected in the step (f) and another portion; and (p) forming a second main electrode layer so as to be electrically connected to a lower main surface of the semiconductor body.

According to the present invention, the manufacturing method of the invention is suitable for manufacturing a field effect type semiconductor device in which two field effect type semiconductor elements having different gate threshold voltages are connected to each other on a single semiconductor body in parallel.

According to the manufacturing method of the invention, such a field effect type semiconductor device as described above can be manufactured easily.

In another aspect of the present invention, a method of manufacturing a field effect type semiconductor device includes the following steps (a) to (p). According to the present invention, the method of manufacturing comprises the steps of: (a) obtaining a semiconductor body having a first semiconductor layer of a first conductivity type with the first semiconductor layer exposed on an upper main surface; (b) forming an oxide film on the upper main surface of the semiconductor body; (c) forming a conductive layer on the oxide film; (d) forming a gate electrode layer having a plurality of first openings by selectively removing the conductive layer; (e) selectively introducing impurity of a second conductivity type in the upper main surface of the semiconductor body through the plurality of first openings by using the gate electrode as a mask to selectively form a plurality of second semiconductor layers of the second conductivity type in an upper surface portion of the first semiconductor layer; (f) diffusing the impurity introduced in the step (e) into the first semiconductor layer to expand the second semiconductor layers to fight under the gate electrode; (g) selectively removing the oxide film existing in each of the plurality of first openings except a center region of each first opening; (h) selectively introducing impurity of the first conductivity type in the upper main surface of the semiconductor body by using the oxide film remaining in the center regions and the gate electrode as masks to form third semiconductor layers of the first conductivity type in the upper surface portion of the second semiconductor layers; (i) forming a shield film selectively covering a region of the gate electrode layer corresponding to the vicinity of at least one of the plurality of first openings and all of the plurality of first openings; (j) selectively introducing impurity of the first conductivity type into the gate electrode layer by using the shield film as a mask to lower electric resistance in a portion of the gate electrode layer except the region covered with the shield film; (k) removing the shield film after the step (j); (l) removing the oxide film remaining in the center regions; (m) forming an insulating film having second openings which open inside the first openings with their opening ends located outside the center regions and covering side surfaces and an upper surface of the gate electrode layer; (n) forming a first main electrode layer so as to be electrically connected to the upper main surface of the semiconductor body exposed in the second openings; (o) separating the first main electrode layer into a portion connected to the upper main surface of the semiconductor body in the at least one of the first openings selected in the step (i) and another portion; and (p) forming a second main electrode layer so as to be electrically connected to a lower main surface of the semiconductor body.

According to the present invention, the manufacturing method of the invention is suitable for manufacturing field effect type semiconductor devices in which two field effect type semiconductor elements having different gate resistances are connected to each other on a single semiconductor body in parallel.

According to the manufacturing method of the invention, such field effect type semiconductor devices as described above can be manufactured easily.

In another aspect of the present invention, a method of manufacturing a field effect type semiconductor device includes the following steps (a) to (p); (a) obtaining a semiconductor body having a first semiconductor layer of a first conductivity type with the first semiconductor layer exposed on an upper main surface; (b) forming a first oxide film on the upper main surface of the semiconductor body; (c) defining a plurality of imaginary regions separated from each other on the upper main surface of the semiconductor body; (d) selectively removing the first oxide film to selectively leave the first oxide film only in the vicinities of outside of all the imaginary regions except at least one of the plurality of imaginary regions; (e) forming a second oxide film thinner than the first oxide film on the upper main surface of the semiconductor body; (f) forming a conductive layer on the first and second oxide films; (g) selectively removing the conductive layer to form a gate electrode layer having the same number of first openings in the plurality of imaginary regions; (h) selectively introducing impurity of a second conductivity type in the upper main surface of the semiconductor body through the plurality of first openings by using the gate electrode as a mask to selectively form a plurality of second semiconductor layers of the second conductivity type on the upper surface portion of the first semiconductor layer; (i) diffusing the impurity introduced in the step (h) into the first semiconductor layer to spread the second semiconductor layers to right under the gate electrode layer; (j) selectively removing the oxide film existing in each of the plurality of first openings except a center region of each first opening; (k) selectively introducing impurity of the first conductivity type in the upper main surface of the semiconductor body by using the oxide film remaining in the center regions and the gate electrode layer as masks to form third semiconductor layers of the first conductivity type in the upper surface portion of the second semiconductor layers; (l) removing the oxide film remaining in the center regions; (m) forming an insulating film having second openings which open inside the first openings with their opening ends being located outside the center regions and covering side surfaces and an upper surface of the gate electrode layer; (n) forming a first main electrode layer so as to be electrically connected to the upper main surface of the semiconductor body exposed in the second openings; (o) separating the first main electrode layer into a portion connected to the upper main surface of the semiconductor body in the first opening corresponding to the at least one imaginary region selected in the step (d) and another portion; and (p) forming a second main electrode layer so as to be electrically connected to a lower main surface of the semiconductor body.

According to the present invention, the manufacturing method of the invention is suitable for manufacturing field effect type semiconductor devices in which two field effect type semiconductor elements having different thicknesses of gate insulating films at least in a part are connected to each other on a single semiconductor body in parallel.

According to the manufacturing method of the invention, such field effect type semiconductor devices as described above can be manufactured easily.

Accordingly, it is an object of the present invention to obtain a field effect type semiconductor device which can consistently realize stable operation of a protection circuit and ensured prevention of breakdown of the device, and also to provide a method suitable for production of the field effect type semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a timing chart showing the operation of a device according to the first preferred embodiment of the present invention.

FIG. 2 is a timing chart showing the principle of the preferred embodiments of the present invention.

FIG. 3 is a timing chart showing the principle of the preferred embodiments of the present invention.

FIG. 11 is a graph illustrating the operation of the device according to the second preferred embodiment of the present invention.

FIG. 12 is a timing chart showing the operation of the device according to the second preferred embodiment of the present invention.

FIG. 44 is a circuit diagram illustrating the operation of the conventional device.

FIG. 45 is a timing chart showing the operation of the conventional device.

DESCRIPTION OF THE PREFERRED EMBODIMENTS

<Principle of Preferred Embodiments>

Before starting description of each of the preferred embodiments of the present invention, the common principle applied to each embodiment will now be described. FIG. 2 is a timing chart illustrating the principle. That is to say, FIG. 2 shows the preferred relation between the main circuit current Im and the sensing current Is in a device having the main IGBT cell 51 and the sense IGBT cell 52 with the same current capacity connected in parallel as shown in FIG. 44. This relation is based on the above-discussed consideration by the inventor about the cause of the surge current.

As shown in FIG. 2, if the sensing current Is rises later than the main circuit current Im in the turn-on period, the surge current ΔIsp does not appear in the sensing current Is, and to the contrary, the surge current appears in the main circuit current Im. In the turn-off period, if the sensing current Is falls earlier than the main circuit current Im, the surge current ΔIsp does not appear in the sensing current Is. That is to say, if the sensing current Is is lower than the main circuit current Im, the surge current ΔIsp does not appear in the sensing current Is, but appears in the main circuit current Im.

In a realistic device in which the number of the main IGBT cells 51 is much larger than that of the sense IGBT cells 52, i.e., the current capacity of the main IGBT cells 51 is much higher than that of the sense IGBT cells 52, which is different from the imaginary device shown in FIG. 44, the main circuit current Im is much larger than the sensing current Is, so that the surge current appearing in the main circuit current Im has only magnitude which can be practically neglected.

As described above, the surge current ΔIsp appearing in the turn-on period is a problem in particular, and the surge current ΔIsp appearing in the turn-off period is not a serious problem in practice. Hence, if the device is constituted so that the sensing current Is rises being delayed from the main circuit current Im at least in the turn-on period, the object of the present invention is accomplished.

Figures 4A, 4B:
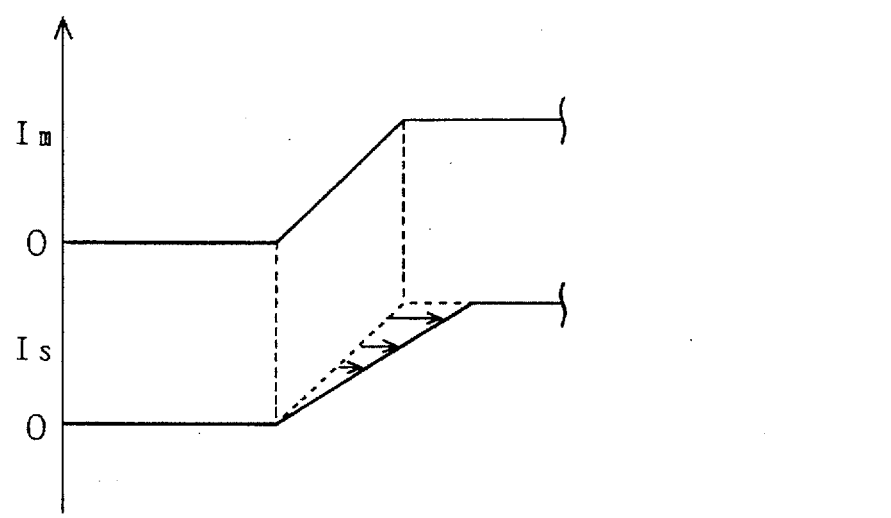
FIG. 4 is a timing chart showing the principle of the preferred embodiments of the present invention.

There are two possible approaches, for example, to make the rise of the sensing current Is delayed from the main circuit current Im. FIG. 3 and FIG. 4 show examples of the different approaches for making the rise of the sensing current Is delayed from the main circuit current Im in the turn-on period, respectively. That is, in the example shown in FIG. 3, the sensing current Is rises at the same inclination as the main circuit current Im, i.e., it rises at the same rising rate, but it is set to be delayed in starting to rise. On the other hand, in the example of device shown in FIG. 4, the sensing current Is starts rising at the same time as the main circuit current Im but it is set to rise at a slower rate.

In both of the examples of device, the sensing current Is rises later than the main circuit current Im. That is, in the turn-on period, when normalized with the current capacity and compared, the sensing current Is is always lower than the main circuit current Im. Accordingly, the surge current ΔIsp never appears in the sensing current Is.

In the devices described in the first through sixth preferred embodiments below, the main circuit current Im and the sensing current Is are set to have the relation shown in either of FIG. 3 and FIG. 4, or the relation of a combination of the two. Also, examples of methods for manufacturing these devices will be described in the seventh through ninth preferred embodiments.

<1. First Preferred Embodiment>

First, a device according to the first preferred embodiment will now be described.

<1-1. Structure of Device>

Figure 5:
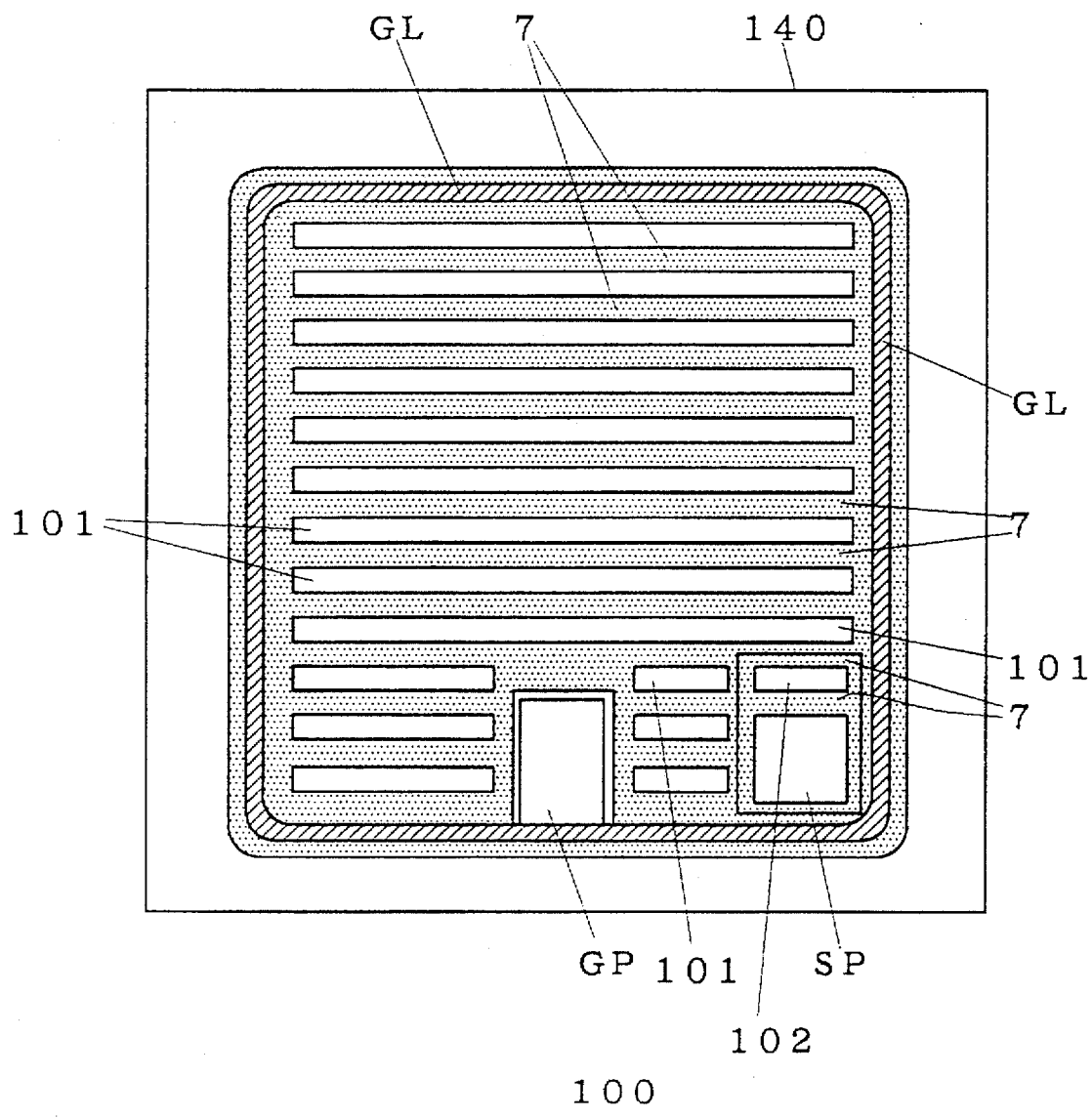
FIG. 5 is a top view of the device according to the first preferred embodiment of the present invention.

FIG. 5 is a top view of a CS-IGBT 100 according to this preferred embodiment, which is depicted with an emitter electrode and an interlayer insulating film described later being omitted. As shown in FIG. 5, a rectangular gate pad GP is provided adjacent to the center of one side on the upper main surface of the semiconductor body 40, and a gate interconnection GL integrally formed is further connected to the gate pad GP.

The gate interconnection GL is provided along the periphery of the upper surface of the CS-IGBT 100. The gate pad GP and the gate interconnection GL are formed of metal with good electric conductivity such as aluminum. Connected to the gate pad GP is an external control output, which serves as a path of supply of a control signal. The gate pad GP and the gate interconnection GL are electrically insulated from the semiconductor body 140.

Main IGBT cells 101 forming a main circuit of the CS-IGBT 100 are arranged in a stripe-like form in the region surrounded by the gate interconnection GL. Also, a sense pad SP is provided in part of the region surrounded by the gate interconnection GL. One sense IGBT cell 102 forming a sensing circuit is provided adjacent to the sense pad SP. The sense pad SP is formed of metal with good electric conductivity such as aluminum and functions as a path of passage of the sensing current Is which is the main current of the sense IGBT cell 102. Gate electrode 7 electrically connected to the gate interconnection GL is provided for both of the main IGBT cells 101 and the sense IGBT cell 102.

Figure 6:
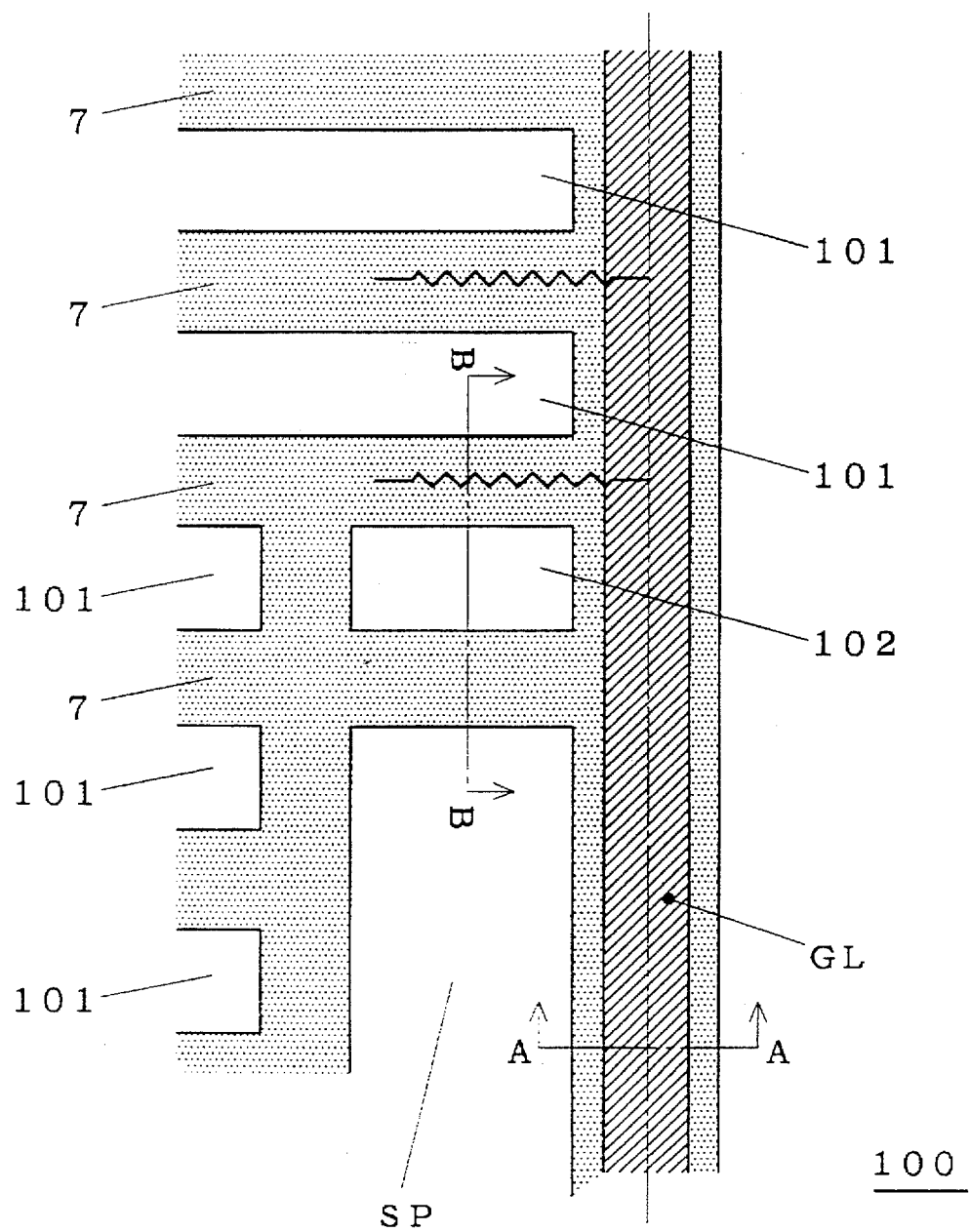
FIG. 6 is a fragmentary enlarged view of FIG. 5.

FIG. 6 is an enlarged fragmentary plan view showing the vicinity of the sense IGBT cell 102 in FIG. 5 being enlarged. As shown in FIG. 6, the gate electrode 7 is provided equivalently both in the portion belonging to the main IGBT cells 101 and the portion belonging to the sense IGBT cell 102.

Figure 7:
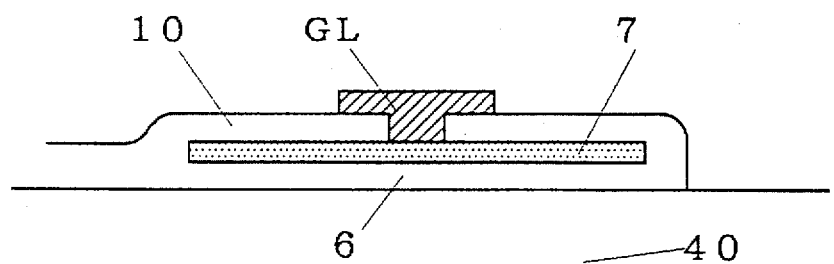
FIG. 7 is a cross sectional view taken along the line A—A in FIG. 6.

FIG. 7 is a sectional diagram taken along the line A—A in FIG. 6. The interlayer insulating film 10 is not omitted but is shown in FIG. 7. As shown in FIG. 7, the gate electrode 7 is provided along the upper main surface of the semiconductor body 140, and is also electrically insulated from the semiconductor body 140 with the gate insulating film 6 interposed therebetween. The gate interconnection GL is provided on the interlayer insulating film 10 covering the gate electrode 7 and is electrically connected to the upper surface of the gate electrode 7 through the trench provided in the interlayer insulating film 10.

Figure 8:
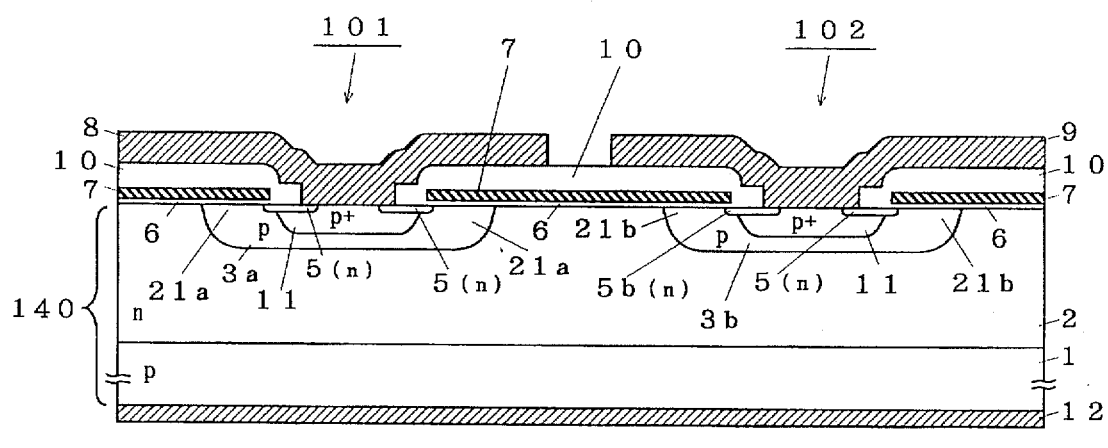
FIG. 8 is a cross sectional view taken along the line B—B in FIG. 6.
Figure 41:
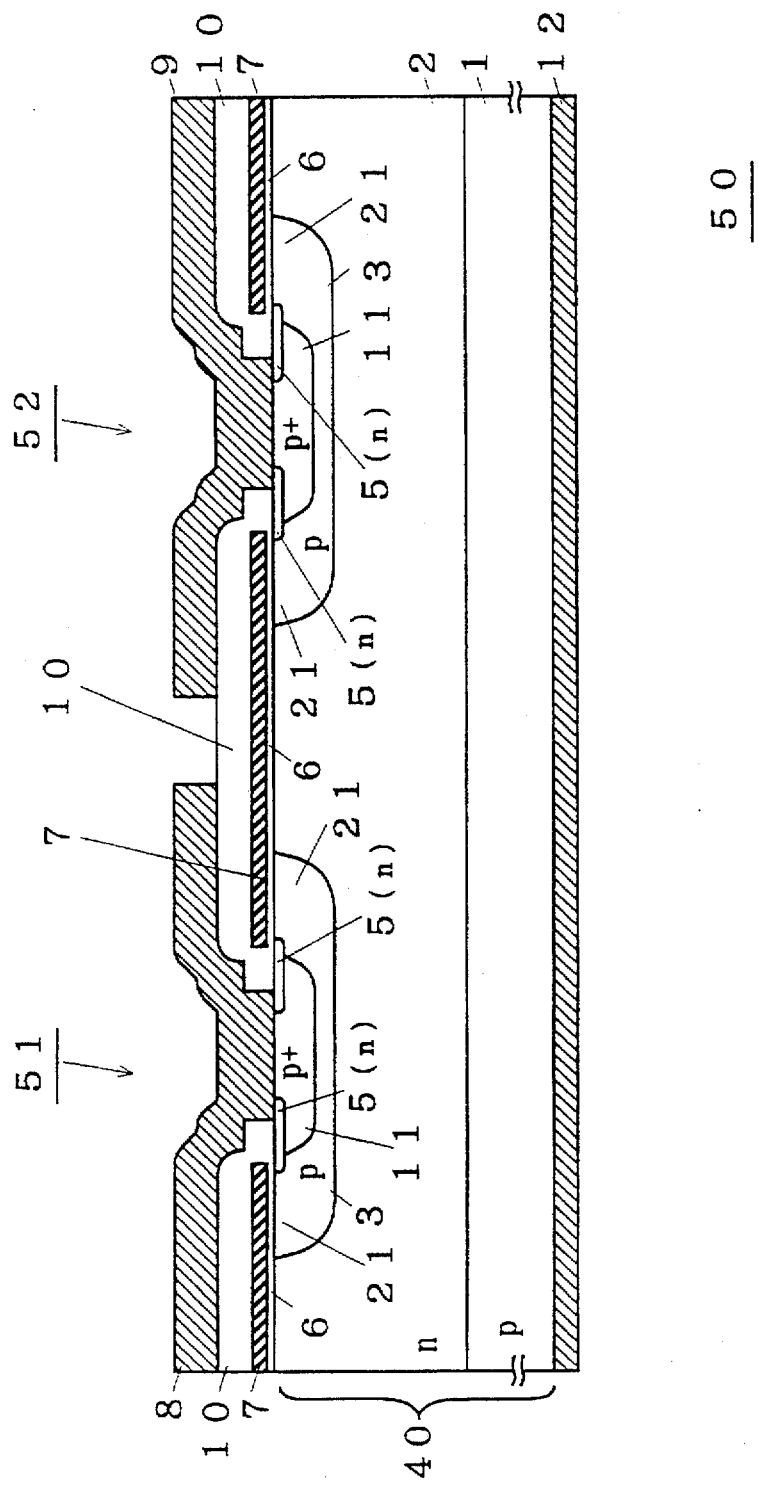
FIG. 41 is a front section view of a conventional device.
Figure 42:
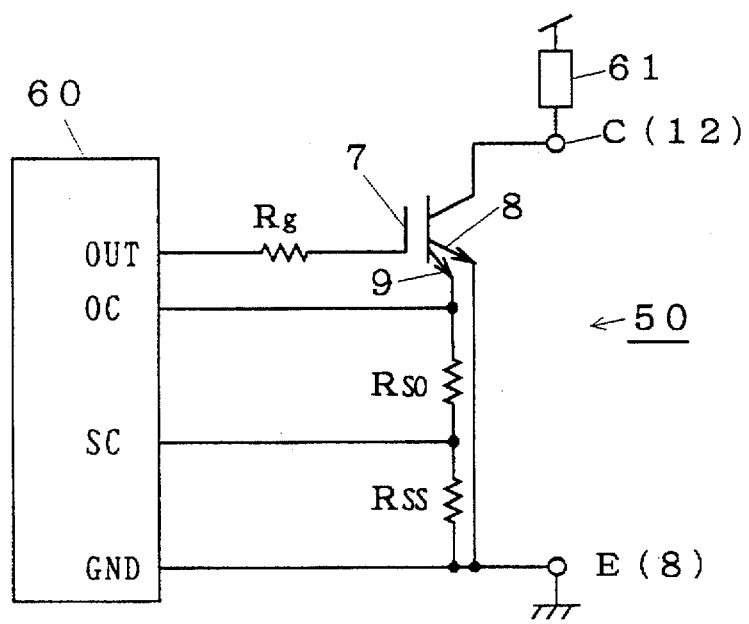
FIG. 42 is a circuit diagram of the conventional device and an external circuit thereof.
Figure 43:
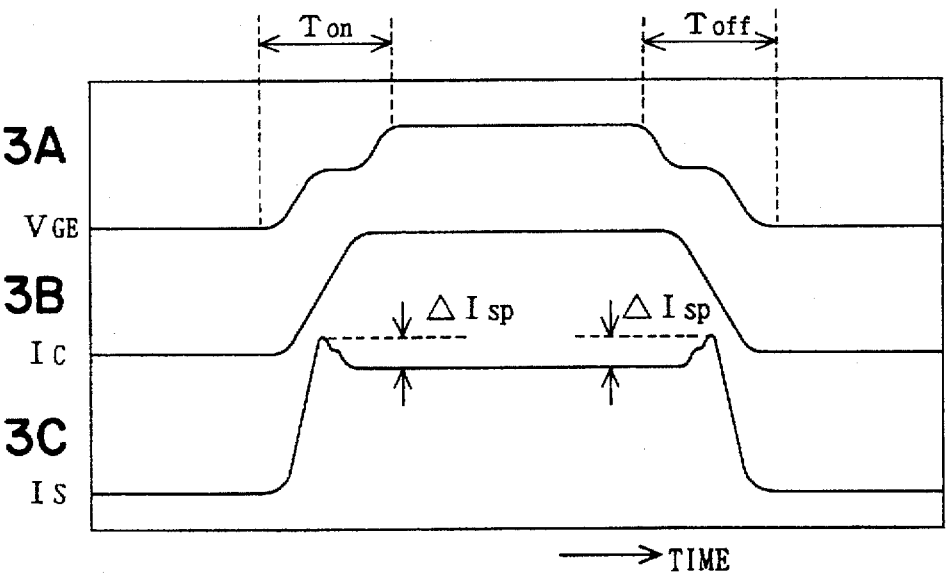
FIG. 43 is a timing chart showing the operation of the conventional device.

FIG. 8 is a sectional view taken along the line B—B in FIG. 5. In FIG. 8, the emitter electrode and interlayer insulating film are both not omitted but illustrated. In the following figures, the portions the same as those in the conventional device 50 shown in FIG. 41 are indicated at the same characteristics and detailed descriptions thereof are not repeated.

In this CS-IGBT 100, the flat board like semiconductor body 140 is comprised of the p collector layer 1 and the n semiconductor layer (first semiconductor layer) 2. On the upper main surface of the semiconductor body 140, that is, on the upper surface of the n semiconductor layer 2, a p base layer (second semiconductor layer) 3a is selectively formed in the region of the main IGBT cell 101 by selectively diffusing n-type impurity, and a p base layer (second semiconductor layer) 3b is selectively formed in the region of the sense IGBT cell 102.

The emitter electrode 8 and the sensing electrode 9 electrically connected to the n emitter layers (third semiconductor layer) 5 and the p$^+$ semiconductor layers 11 are formed of aluminum, for example. The gate electrode (gate electrode layer) 7 is formed facing to the upper surface of the p base layer 3a interposed between the n semiconductor layer 2 and the n emitter layer 5a, i.e., the channel region 21a, and the upper surface of the p base layer 3b interposed between the n semiconductor layer 2 and the n emitter layer 5b, i.e., the channel region 21b. This gate electrode 7 is formed of polysilicon, for example. The interlayer insulating film 10 insulating the gate electrode 7 and the emitter electrode (first main electrode layer) 8, and the sensing electrode (first main electrode layer) 9 is formed of an oxide film, for example.

The emitter electrode 8 is formed integrally throughout all the main IGBT cells 101. The collector electrode 12 is also formed integrally through all the main IGBT cells 51 and the sense IGBT cell 52. The collector electrode (second main electrode layer) 12 is formed of metal such as Al—Mo—Ni—Au, for example.

In the CS-IGBT 100, the concentrations of impurity in the p base layer 3a and the p base layer 3b are set to be different from each other. That is to say, the concentration of impurity in the p base layer 3b is set to be higher than that in the p base layer 3a. This point is characteristically different from the conventional CS-IGBT 50. Other features in structure have no difference between the main IGBT cell 101 and the sense IGBT cell 102.

Furthermore, the number of the main IGBT cells 101 in the entire device is larger by far than the sense IGBT cells 102 as shown in FIG. 5. Accordingly, the channel width (Wm) of the main IGBT cells 101 all over the entire CS-IGBT 100 is sufficiently larger than the channel width (Ws) of the sense IGBT cells 102. That is to say, the CS-IGBT 100 is constituted so that Wm>>Ws.

<1-2. Characteristic Operation of the Device>

In this CS-IGBT 100 which is formed as described above, operation thereof is characteristically different from that of the conventional CS-IGBT 50 in the following points. That is to say, in the CS-IGBT 100, as the concentration of impurity in the p base layer 3b is set to be higher than that in the p base layer 3a, the gate threshold voltage $V_{GE(th)}$ of the sense IGBT cell 102 is higher than the main IGBT cell 101. Accordingly, when the CS-IGBT 100 turns on, the sensing current Is rises being delayed from the main circuit current Im.

FIG. 1 is a timing chart for describing this point. That is, FIG. 1 schematically shows change in time of the gate voltage $V_{GE}$, the main circuit current Im and the sensing current Is. The gate electrode 7 is electrically connected throughout all the main IGBT cells 101 and the sense IGBT cells 102 and it is equivalent in structure as mentioned above. Accordingly, the gate voltage $V_{GE}$ is common between the main IGBT cell 101 and the sense IGBT cell 102. The curve about the gate voltage $V_{GE}$ in FIG. 1 shows this. That is, in FIG. 1, the gate voltage $V_{GE}$ is the gate voltage $V_{GE}$ in the main IGBT cell 101 and also it is the gate voltage $V_{GE}$ in the sense IGBT cell 102.

As the gate threshold voltage $V_{GE(th)}$ in the sense IGBT cell 102 (denoted as $V_{GE(th)S}$) is set to have a value larger than that of the gate threshold voltage $V_{GE(th)}$ in the main IGBT cell 101 (denoted as $V_{GE(th)M}$), a limited time $\Delta t$ is required from when the gate voltage $V_{GE}$ reaches the value of the gate threshold voltage $V_{GE(th)M}$ to when it reaches the value of the gate threshold voltage $V_{GE(th)S}$ in the turn-on period.

Accordingly, a time delay corresponding to the time $\Delta t$ occurs between the rise of the main circuit current Im and the rise of the sensing current Is. That is, in the turn-on period, the change in time of the sensing current Is is represented as the curve which is shifted backward by the time A from the main circuit current Im. Therefore, the rise of the sensing current Is is delayed from the main circuit current Im. In other words, when normalized with the current capacity and compared, the sensing current Is has a value always lower than that of the main circuit current Im. Thus, the surge current $\Delta$Isp does not appear in the sensing current Is.

On the other hand, in the turn-off period, to the contrary, the limited time $\Delta t$ is required from when the gate voltage $V_{GE}$ reaches the value of the gate threshold voltage $V_{GE(th)S}$ until it reaches the value of the gate threshold voltage $V_{GE(th)M}$. Accordingly, a time delay occurs corresponding to the time $\Delta t$ between the fall of the sensing current Is and the fall of the main circuit current Im. That is, in the turn-off period, the change in time of the sensing current Is is represented as the curve shifted frontward by the time $\Delta t$ from the main circuit current Im. Thus, in the turn-off period, when normalized and compared, the sensing current Is always has a value lower than that of the main circuit current Im, so that the surge current $\Delta$Isp does not appear in the sensing current Is.

That is to say, in the device 100 of this preferred embodiment, the surge current $\Delta$Isp superimposed on the sensing current Is is suppressed in both of the turn-on period and the turn-off period.

<1-3. Corroborating Test>

Next, the experiment for corroborating the above-described characteristic operation in the device 100 of this preferred embodiment and the results thereof will be described. In the experiment, the change of the surge current $\Delta$Isp with the concentrations of impurity in the p base layer 3a and the p base layer 3b variously changed in the CS-IGBT 100.

Figure 9:
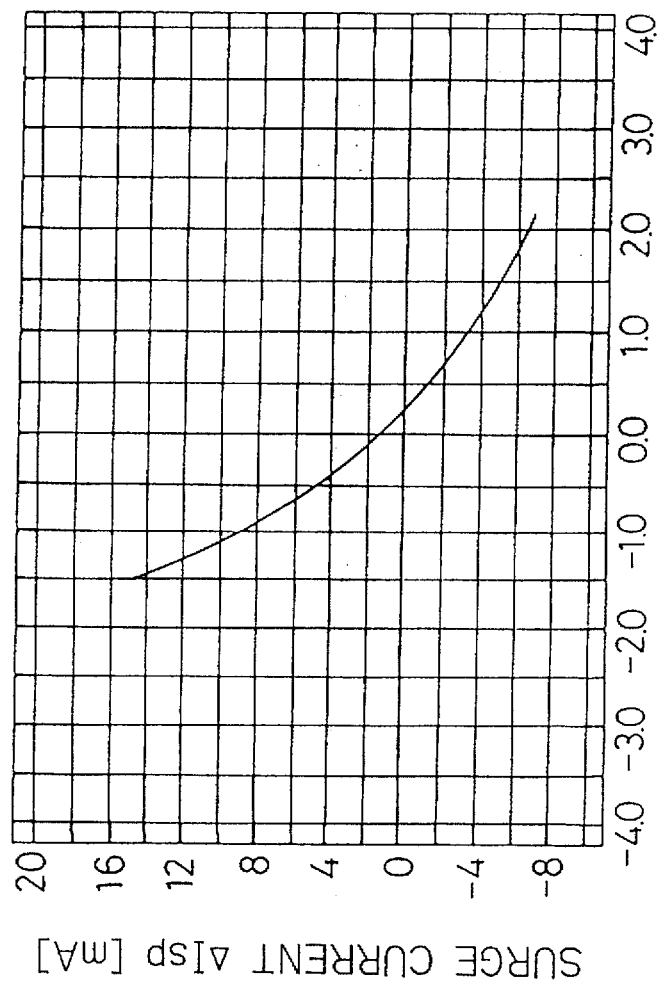
FIG. 9 is a graph showing results of a corroborating test of the device according to the first preferred embodiment of the present invention.

FIG. 9 is a graph showing the results of the experiment about the turn-on period. In FIG. 9, the abscissa represents a difference between the two gate threshold voltages $V_{GE(th)}$, i.e., $\Delta Vth = V_{GE(th)S} - V_{GE(th)M}$, and the ordinate represents the magnitude of the surge current $\Delta Isp$ appearing in the sensing current Is. As clearly seen from FIG. 9, when it is set so that the $\Delta Vth$ is positive, in other words, so that the gate threshold voltage $V_{GE(th)S}$ is higher than the gate threshold voltage $V_{GE(th)M}$, the surge current $\Delta Isp$ disappears. The same result is obtained in the turn-off period, too.

That is, the results of the experiment corroborate the characteristic operation of the CS-IGBT 100 described above. At the same time, this also supports the consideration by the inventor about the cause of occurrence of the surge current $\Delta Isp$.

<2. Second Preferred Embodiment>

Figure 10:
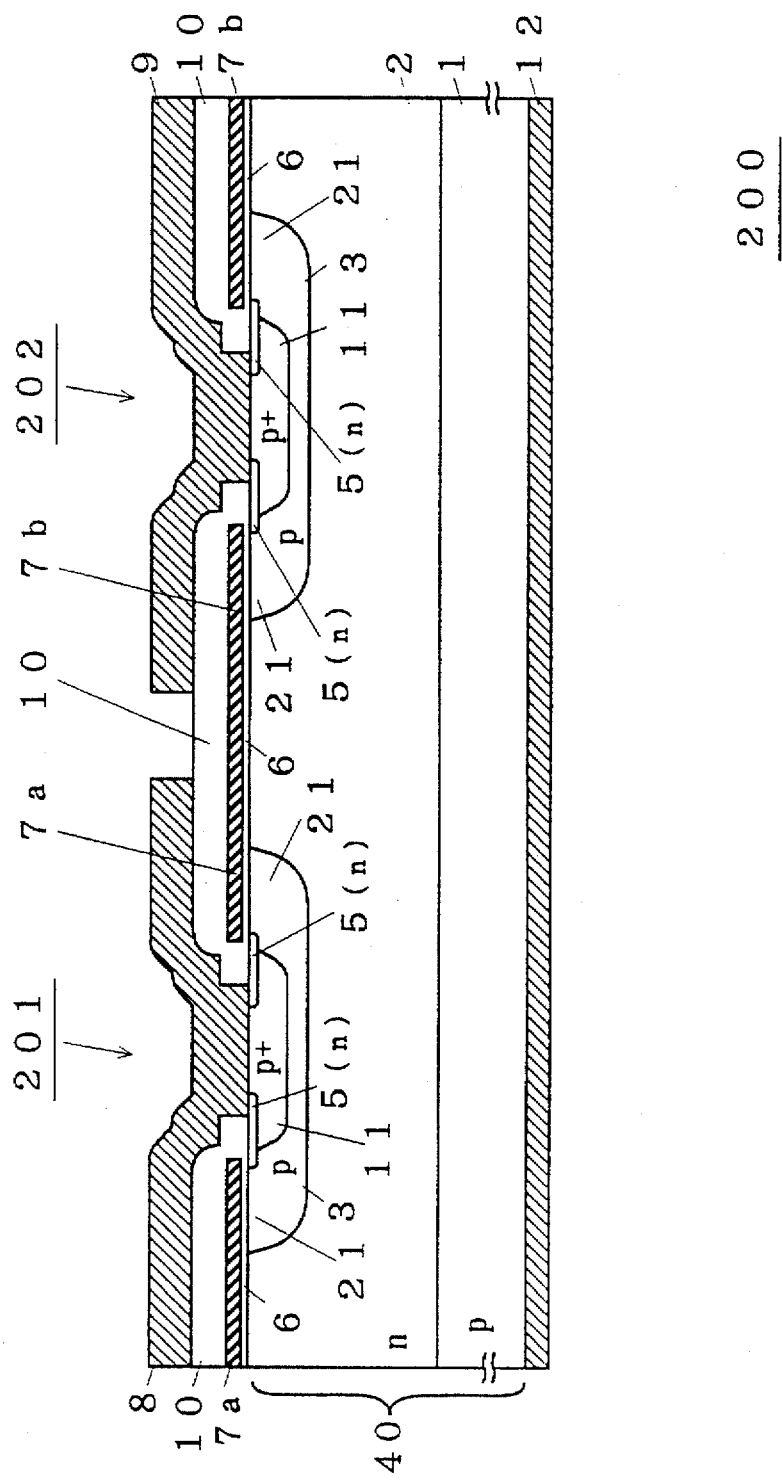
FIG. 10 is a front section view of a device according to the second preferred embodiment of the present invention.

Next, a device according to the second preferred embodiment will be described. The structure of the upper surface of a CS-IGBT 200 which is a device of this preferred embodiment is shown in FIGS. 5–7 in the same way as the CS-IGBT 100. FIG. 10 is a sectional view of the CS-IGBT taken along the line B—B in FIG. 5. That is, FIG. 10 shows a portion in which a main IGBT cell 201 forming a main circuit of the CS-IGBT 200 and a sense IGBT cell 202 forming a sensing circuit are formed adjacent to each other.

This CS-IGBT 200 is characteristically different from the conventional CS-IGBT 50 in that the conductivity is different between the gate electrode 7a belonging to the main IGBT cell 201 and the gate electrode 7b belonging to the sense IGBT cell 202. That is, the concentration of impurity introduced in the gate electrode 7a formed of polysilicon is set to be higher than that in the gate electrode 7b also formed of polysilicon.

Accordingly, the conductivity is larger in the gate electrode 7a than in the gate electrode 7b. In other words, the sheet resistance is set to be larger in the gate electrode 7b than in the gate electrode 7a. In other structure, the main IGBT cell 201 and the sense IGBT cell 202 have no difference.

The CS-IGBT 200 is formed in this way, of which operation is characteristically different from that of the conventional CS-IGBT 50 in the following point. That is, as there is no remarkable difference between the main IGBT cell 201 and the sense IGBT cell 202 except that the conductivity is different between the gate electrode 7a and the gate electrode 7b, the rise time $t_{rise}$ is different between the main IGBT cell 201 and the sense IGBT cell 202.

FIG. 11 is a graph for illustrating the definition of the rise time $t_{rise}$. As shown in the graph, the rise time $t_{rise}$ is defined as a time required from when the gate voltage $V_{GE}$ rises 10% until when it rises to 90%. That is, the rise time $t_{rise}$ is an index representing the rate of rise of the gate voltage $V_{GE}$.

This rise time $t_{rise}$ is given by the expression 1 using the gate resistance Rg and the gate input capacitance Cies.

$$T_{rise} = 2.2 \times Rg \times Cies \qquad (1)$$

The gate input capacitance Cies is composed of two components as shown by the expression 2.

$$Cies = Cge + Cgc \qquad (2)$$

That is, the gate input capacitance Cies is represented by a sum of the gate-emitter capacitance Cge and the gate-collector capacitance Cgc.

In the CS-IGBT 200, as mentioned above, the sheet resistance is different between the gate electrode 7a and the gate electrode 7b, and furthermore, the sheet resistance of the gate electrode 7b is larger. Therefore, the relation Rgm<Rgs holds between the gate resistance Rg of the main IGBT cell 201 (denoted as Rgm) and the gate resistance Rg of the sense IGBT cell 202 (denoted as Rgs).

Since there is no other structural difference between the main IGBT cell 201 and the sense IGBT cell 202 in other points, both the gate-emitter capacitance Cge and the gate-collector capacitance Cgc have no special difference between the two kinds of the IGBT cells. Therefore, from the relation of the expression 1, the rise time $t_{rise}$ is larger in the sense IGBT cell 202 than in the main IGBT cell 201. As a result, the sensing current Is rises more slowly than the main circuit current Im.

FIG. 12 is a timing chart for illustrating this. That is, FIG. 12 schematically shows the changes in time of the gate voltage $V_{GE}$ of the main IGBT cell 201 (represented as $V_{GEM}$) in the turn-on period, the gate voltage $V_{GE}$ of the sense IGBT cell 202 (represented as $V_{GES}$), the main circuit current Im, and the sensing current Is.

As shown in FIG. 12, as the rise time $t_{rise}$ of the main IGBT cell 201 (represented as $t_{riseM}$) and the rise time $t_{rise}$ of the sense IGBT cell 202 (represented as $t_{riseS}$) have the relation $t_{riseM} < t_{riseS}$, the time when the gate voltage $V_{GE}$ exceeds the gate threshold voltage $V_{GE(th)S}$ is delayed from the time when the gate voltage $V_{GEM}$ exceeds the gate threshold voltage $V_{GE(th)M}$. In accordance with it, the sensing current Is starts rising later than the main circuit current Im by the limited time $\Delta_{t_1}$.

Furthermore, as the rising rate of the gate voltage $V_{GES}$ is slower than the gate voltage $V_{GEM}$, the rising rate of the sensing current Is is also slower than the main circuit current Im. Accordingly, the sensing current Is reaches the steady value being delayed from the main circuit current Im by $\Delta t_2$ ($> \Delta t_1$).

That is to say, the sensing current Is rises being delayed from the main circuit current Im. In other words, in the turn-on period, when normalized with the current capacity and compared, the sensing current Is is always lower than the main circuit current Im. Thus, the surge current $\Delta Isp$ does not appear in the sensing current Is.

Now, generally, the rise time $t_{rise}$ preferably has the ratio in the range about 0.5–0.9 between the main IGBT cell and the sense IGBT cell. That is, it is preferred that setting is made so that $0.5 \leq t_{riseM}/t_{riseS} \leq 0.9$. Accordingly, it is preferred that setting is made in the CS-IGBT 200 so that the ratio of Rgm and Rgs is $0.5 \leq Rgm/Rgs \leq 0.9$.

<3. Third Preferred Embodiment>

Figure 13:
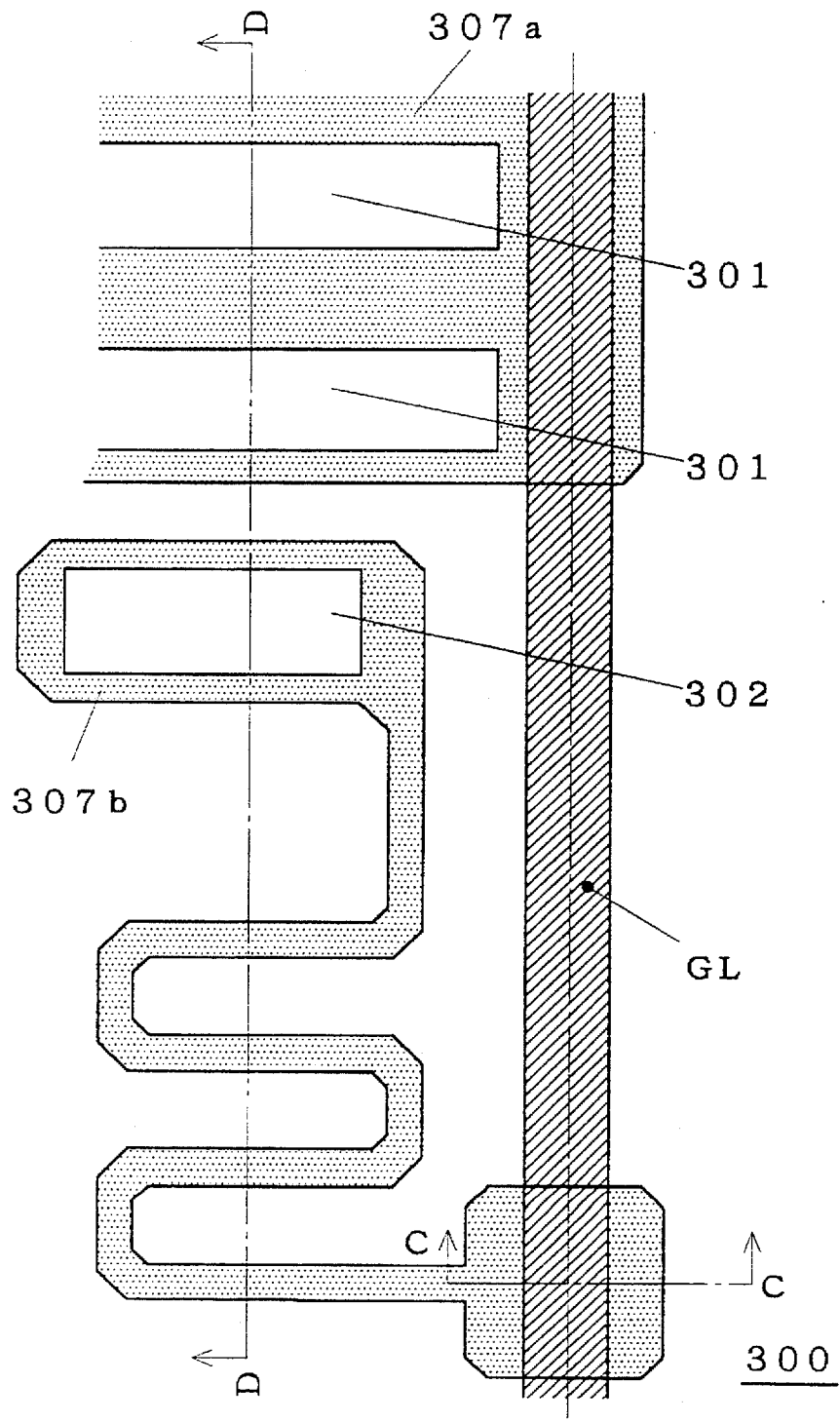
FIG. 13 is a top view of a device according to the third preferred embodiment of the present invention.

Next, a device according to the third preferred embodiment will be described. FIG. 13 is a fragmentary enlarged plan view in a CS-IGBT 300 which is a device of this preferred embodiment. The CS-IGBT 300 is provided with main IGBT cells 301 constituting a main circuit and a sense IGBT cell 302 constituting a sensing circuit. FIG. 13 shows the vicinity of the sense IGBT cell 302 being enlarged and the emitter electrode and the interlayer insulating film are omitted and not shown.

As shown in FIG. 13, the gate electrode 307a belonging to the main IGBT cell 301 and the gate electrode 307b belonging to the sense IGBT cell 302 are provided in characteristically different forms. That is, the gate electrode 307a is provided so as to connect the gate interconnection GL and the main IGBT cells 301 in the shortest path similarly to the gate electrode 7 in the CS-IGBT 100, for example. On the other hand, the gate electrode 307b is provided so as to couple between the sense IGBT cell 302 and the gate interconnection GL in a roundabout way. Furthermore, the gate electrode 307b has a width narrower than the gate electrode 307a. That is, the gate electrode 307b is set to have the gate resistance Rg sufficiently larger as compared with the gate electrode 307a.

Figure 14:
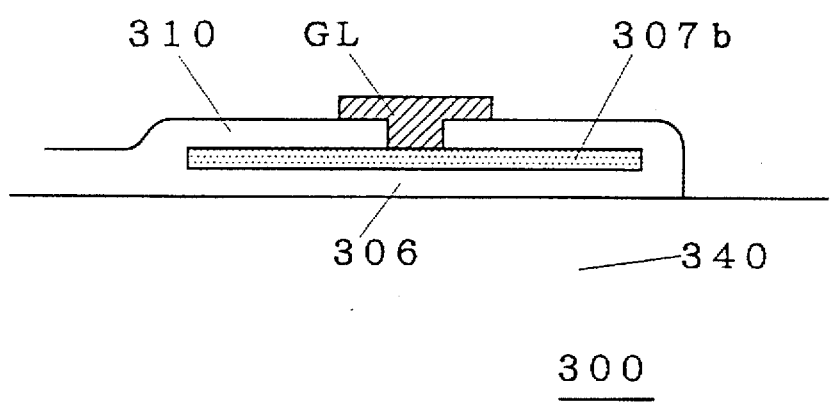
FIG. 14 is a cross sectional view taken along the line C—C in FIG. 13.

FIG. 14 is a cross sectional view taken along the line C—C in FIG. 13. In FIG. 14, an interlayer insulating film 310 is not omitted but is shown. As shown in FIG. 14, the gate electrode 307b is provided along the upper main surface of a semiconductor body 340, and is electrically insulated from the semiconductor body 340 by the gate insulating film 306 interposed therebetween. The gate interconnection GL is provided on the interlayer insulating film 310 covering the gate electrode 307b and is electrically connected to the upper surface of the gate electrode 307b through the trench provided in the interlayer insulating film 310.

Figure 15:
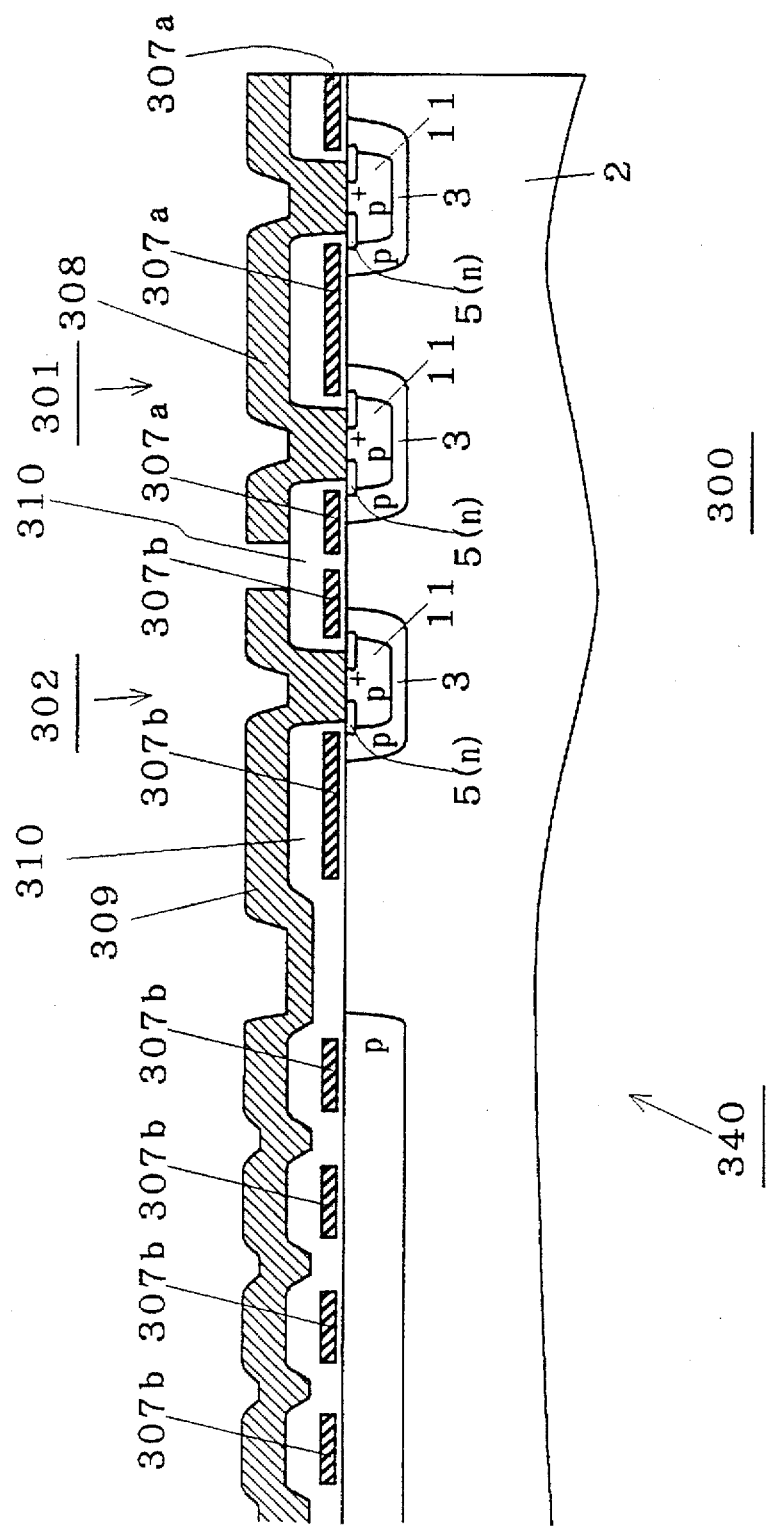
FIG. 15 is a cross sectional view taken along the line D—D in FIG. 13.

FIG. 15 is a cross sectional view taken along the line D—D in FIG. 5. In FIG. 15, the emitter electrode and the interlayer insulating film are shown without being omitted. As shown in FIG. 15, the gate electrode 307a belonging to the main cell 301 and the emitter electrode 308, and the gate electrode 307b belonging to the sense IGBT cell 302 and the sensing electrode 309 are both electrically insulated by the interlayer insulating film 310 formed of oxide or the like.

As stated above, in the CS-IGBT 300, there is no characteristic differences between the main IGBT cell 301 and the sense IGBT cell 302 except that the gate resistance Rg of the gate electrode 307a and that of the gate electrode 307b are different from each other. Accordingly, in the gate input capacitance Cies given by the expression 2, there is no special difference between the two IGBT cells. Therefore, as given by the expression 1, the rise time $t_{rise}$ differs between the two IGBT cells. That is, the rise time $t_{rise}$ of the sense IGBT cell 302 is larger than that of the main IGBT cell 301.

As a result, the sensing current Is rises more slowly as compared with the main circuit current Im. That is, in the turn-on period, the changes in time of the gate voltage $V_{GEM}$ of the main IGBT cell 301, the gate voltage $V_{GES}$ of the sense IGBT cell 302, the main circuit current Im and the sensing current Is are shown in the timing chart of FIG. 12. Accordingly, the surge current ΔIsp does not appear in the sensing current Is.

In the CS-IGBT 300, on the basis of the same reason as that described about the CS-IGBT 200, the ratio of Rgm and Rgs is preferably set so that 0.5≦Rgm/Rgs≦0.

<4. Fourth Preferred Embodiment>

Figure 16:
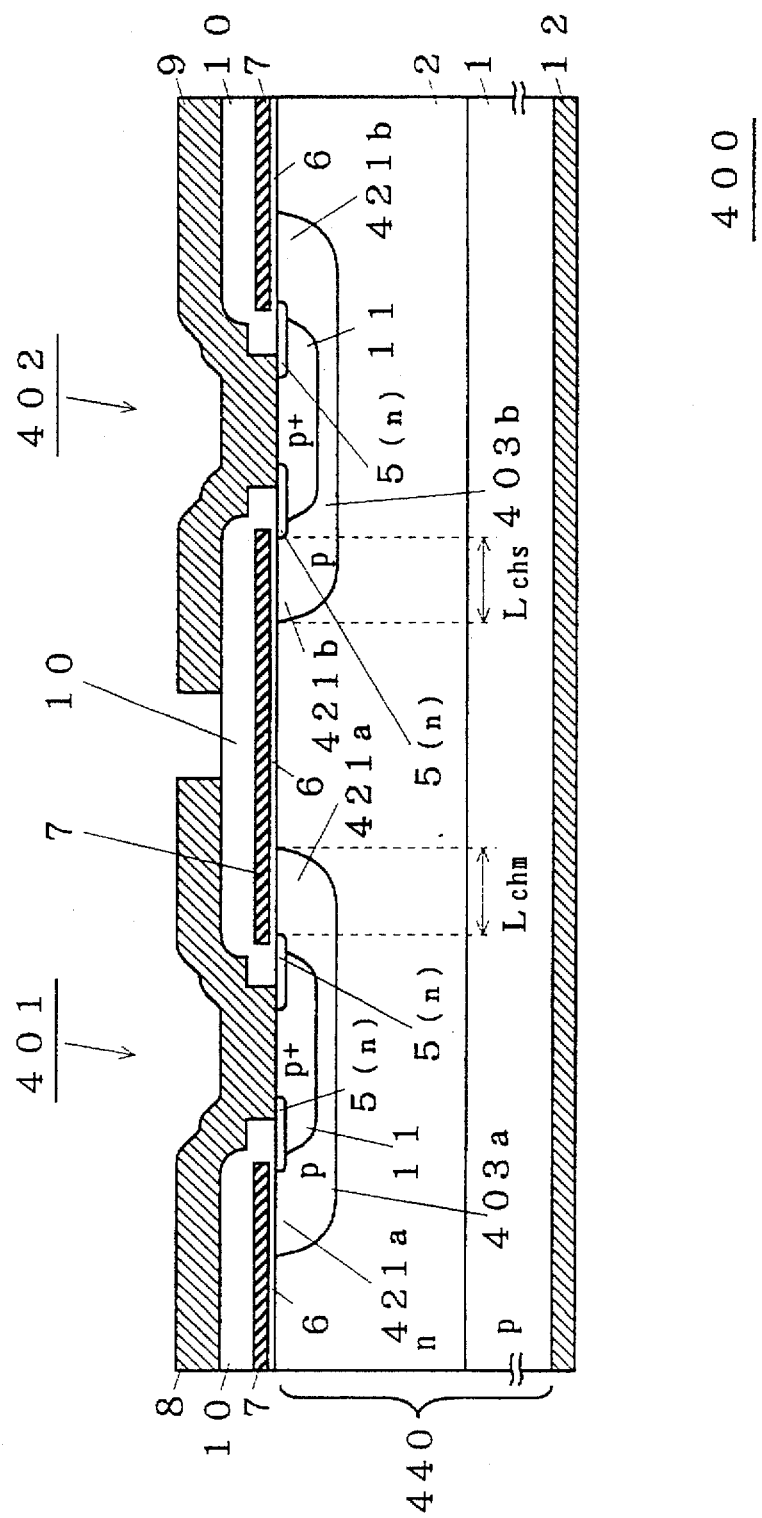
FIG. 16 is a front section view showing a device according to the fourth preferred embodiment of the present invention.

Next, a device of the fourth preferred embodiment will be described. The structure of the upper surface of a CS-IGBT 400 which is a device according to this preferred embodiment is represented by FIGS. 5 to 7 in the same way as the CS-IGBT 100. FIG. 16 is a cross sectional view of the CS-IGBT 400 taken along the line B—B in FIG. 5. That is, FIG. 16 shows the portion in which a main IGBT cell 401 constituting a main circuit and a sense IGBT cell 402 constituting a sensing circuit in the CS-IGBT 400 are formed adjacent to each other.

In this CS-IGBT 400, the p collector layer 1 and the n semiconductor layer 2 form a flat board like semiconductor body 440. On the upper main surface of the semiconductor body 440, i.e., on the upper surface of the n semiconductor layer 2, a p base layer 403a is selectively formed in the region of the main IGBT cell 401 by selectively diffusing p-type impurity and a p base layer 403b is selectively formed in the region of the sense IGBT cell 402.

The p base layer 403a and the p base layer 403b are different from each other in the diffusion depth of the p-type impurity forming these semiconductor layers. That is, the p-type impurity is diffused deeper in the p base layer 403b than in the p base layer 403a. Accordingly, the length of the channel region 421b formed in the p base layer 403b, i.e., the channel length Lchs in the sense IGBT cell 402 is set to be longer than the length of the channel region 421a formed in the p base layer 403a, i.e., the channel length Lchm in the main IGBT cell 401.

Hence, the gate-emitter capacitance Cge is larger in the sense IGBT cell 402 than in the main IGBT cell 401. Other features in structure are the same as the CS-IGBT 100, for example. Accordingly, except the difference in the channel length, there is no characteristic difference in structure between the main IGBT cell 401 and the sense IGBT cell 402. Therefore, both the gate-collector capacitance Cgc and the gate resistance Rg have no special difference between the two IGBT cells.

As a result, as shown by the expression 2, the gate input capacitance Cies is larger in the sense IGBT cell 402 than in the main IGBT cell 401. Therefore, since there is no difference in the gate resistance Rg, as given by the expression 1, the rise time $t_{rise}$ differs between the two IGBT cells. That is to say, the rise time $t_{rise}$ is larger in the sense IGBT cell 402 than in the main IGBT cell 401.

As a result, the sensing current Is rises slowly as compared with the main circuit current Im. That is, in the turn-on period, the changes in time of the gate voltage $V_{GEM}$ of the main IGBT cell 401, the gate voltage $V_{GES}$ of the sense IGBT cell 402, the main circuit current Im and the sensing current Is are shown in the timing chart of FIG. 12. Accordingly, the surge current ΔIsp does not appear in the sensing current Is.

Now, as discussed before, the rise time $t_{rise}$ is preferably set so that $0.5 \leq t_{riseM}/t_{riseS} \leq 0.9$. Accordingly, it is preferred that the ratio of the gate input capacitance Ciesm of the main IGBT cell 401 and the gate input capacitance Ciess of the sense IGBT cell 402 is set so that 0.5≦Ciesm/Ciess≦0.9.

From this, it is concluded that the preferred ratio between the gate-emitter capacitance Cgem of the main IGBT cell 401 and the gate-emitter capacitance Cges of the sense IGBT cell 402 is 0.5≦Cgem/Cges≦0.9. This further means that the preferred ratio between the channel length Lchm and the channel length Lchs is 0.5≦Lchm/Lchs≦0.9.

<5. Fifth Preferred Embodiment>

Figure 17:
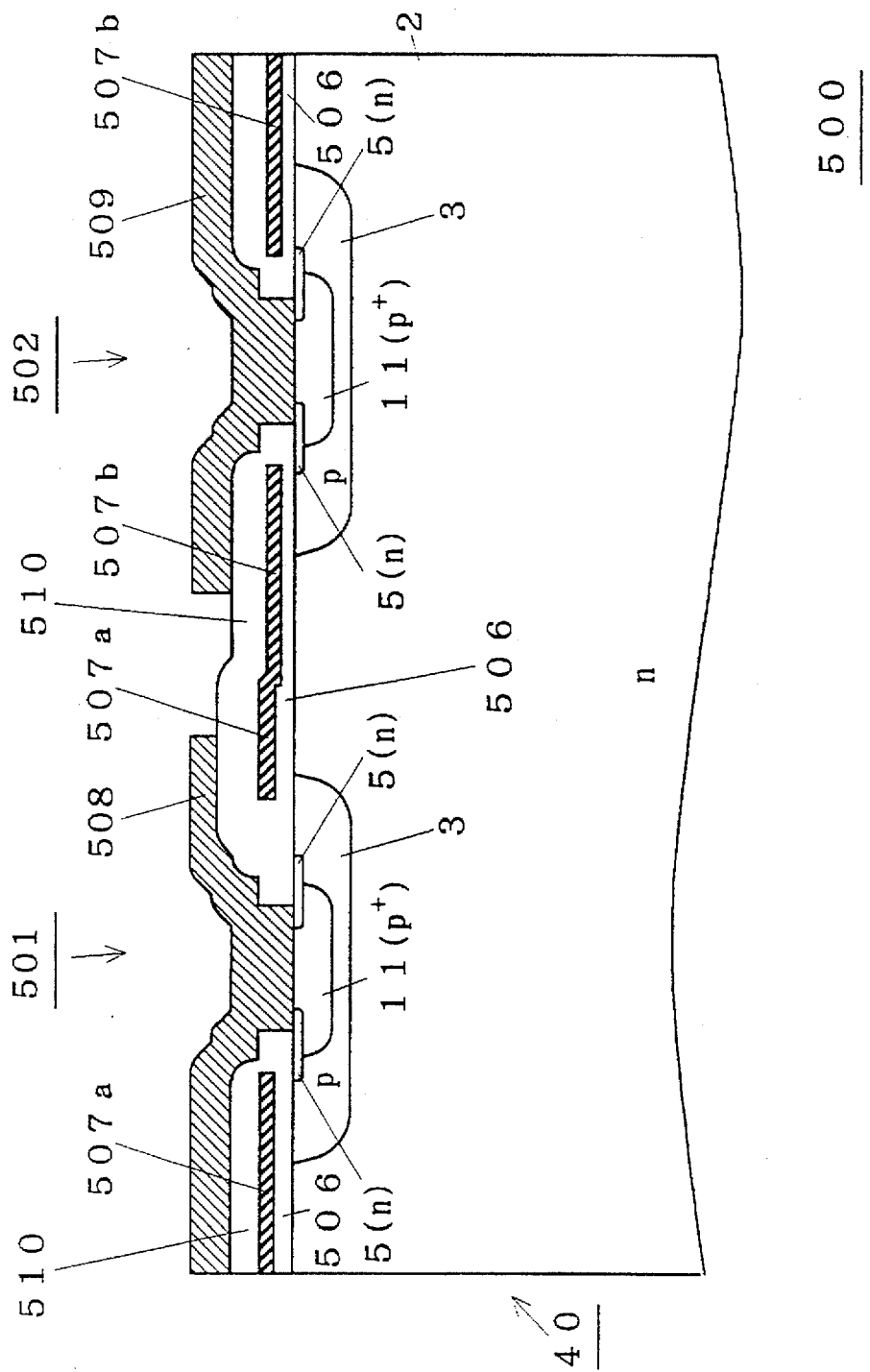
FIG. 17 is a front section view showing a device according to the fifth preferred embodiment of the present invention.

Next, a device of the fifth preferred embodiment will be described. The structure of the upper surface in a CS-IGBT 500, the device according to this preferred embodiment, is represented in FIGS. 5 to 7 as the CS-IGBT 100. FIG. 17 is a cross sectional view of the CS-IGBT 500 taken along the line B—B in FIG. 5. That is, FIG. 17 shows the portion in which a main IGBT cell 501 constituting a main circuit and a sense IGBT cell 502 constituting a sensing circuit in the CS-IGBT 500 are formed adjacent to each other.

As shown in FIG. 17, a gate electrode 507a belonging to the main IGBT cell 501 and a gate electrode 507b belonging to the sense IGBT cell 502 have different distances from the upper main surface of the semiconductor body 40. That is, the gate electrode 507b is provided closer to the upper main surface of the semiconductor body 40 than the gate electrode 507a. In other words, a gate insulating film 506 electrically insulating these gate electrodes and the semiconductor body 40 is thicker in the main IGBT cell 501 and is thinner in the sense IGBT cell 502. Therefore, the gate-emitter capacitance Cge and the gate-collector capacitance Cgc are larger in the sense IGBT cell 502 than in the main IGBT cell 501. The gate insulating film 506 is formed of oxide, for example.

The emitter electrode 508 and the gate electrode 507a, and the sensing electrode 509 and the gate electrode 507b are both electrically insulated by the interlayer insulating film 510 formed of oxide or the like. Thus, in the CS-IGBT 500, there is no special difference between the main IGBT cell 501 and the sense IGBT cell 502 except that the distances between the two kinds of gate electrodes 507a and 507b and the semiconductor body 40 are different from each other. Accordingly, the gate resistance Rg has no special difference between the two IGBT cells.

As a result, as shown by the expression 2, the gate input capacitance Cies is larger in the sense IGBT cell 502 than in the main IGBT cell 501. Therefore, since there is no difference in the gate resistance Rg, the rise time $t_{rise}$ differs between the two IGBT cells as given by the expression 1. That is to say, the rise time $t_{rise}$ is larger in the sense IGBT cell 502 than in the main IGBT cell 501.

As a result, the sensing current Is rises slowly as compared with the main circuit current Im. That is, in the turn-on period, the changes in time of the gate voltage $V_{GEM}$ of the main IGBT cell 501, the gate voltage $V_{GES}$ of the sense IGBT cell 502, the main circuit current Im and the sensing current Is are shown in the timing chart of FIG. 12. Accordingly, the surge current ΔIsp does not appear in the sensing current Is.

As stated before, it is preferred that the ratio of the gate input capacitance Ciesm and the gate input capacitance Ciess is set so that $0.5 \leq Ciesm/Ciess \leq 0.9$. Accordingly, it is concluded that the preferred ratio between the thickness $t_{OXGM}$ of the gate insulating film 506 in the main IGBT cell 501 and the thickness $t_{OXGS}$ in the sense IGBT cell 502 is $0.5 \leq t_{OXGS}/T_{oxgm} \leq 0.9$.

<6. Sixth Preferred Embodiment>

Figure 18:
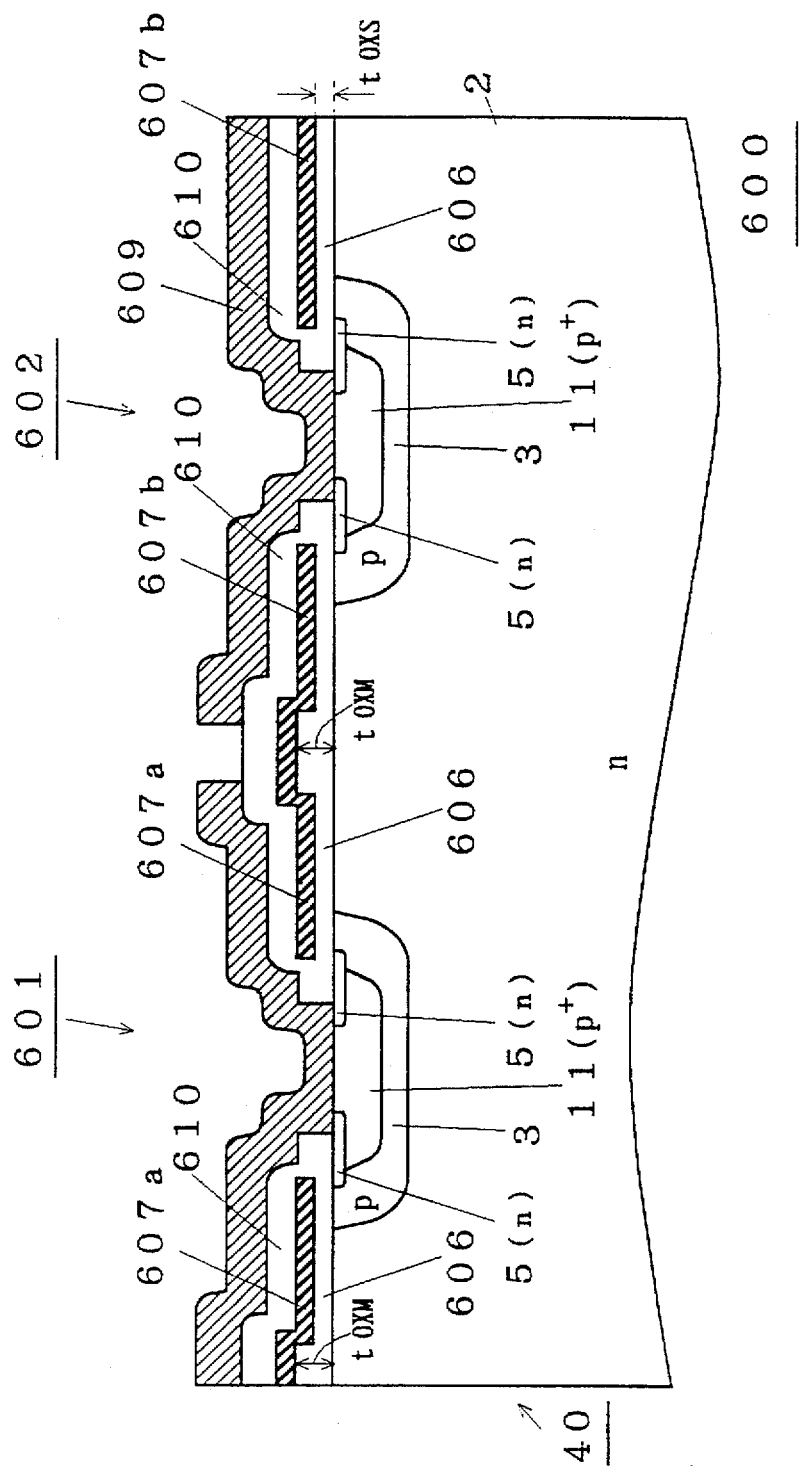
FIG. 18 is a front section view showing a device according to the sixth preferred embodiment of the present invention.

Next, a device of the sixth preferred embodiment will be described. The structure of the upper surface in a CS-IGBT 600, the device according to this preferred embodiment, is represented in FIGS. 5 to 7 as the CS-IGBT 100. FIG. 18 is a cross sectional view of the CS-IGBT 600 taken along the line B—B in FIG. 5. That is, FIG. 18 shows the portion in which a main IGBT cell 601 constituting a main circuit and a sense IGBT cell 602 constituting a sensing circuit in the CS-IGBT 600 are formed adjacent to each other.

As shown in FIG. 18, the gate electrode 607a belonging to the main IGBT cell 601 and the gate electrode 607b belonging to the sense IGBT cell 602 have different distances from the upper surface of the n semiconductor layer 2 at least in part of the portion facing the upper surface thereof. That is, the gate electrode 607b is provided closer to the upper main surface of the n semiconductor layer 2 than the gate electrode 607a.

In other words, a gate insulating film 606 electrically insulating these gate electrodes and the semiconductor body 40 is thicker on the upper surface of the n semiconductor layer 2 belonging to the main IGBT cell 601 and is thinner on the upper surface of the n semiconductor layer 2 belonging to the sense IGBT cell 602. That is, the thickness $t_{OXM}$ of the portion facing the upper surface of the n semiconductor layer 2 in the gate insulating film 606 which belongs to the main IGBT cell 601 and the thickness $t_{OXS}$ of the portion facing the upper surface of the n semiconductor layer 2 in the gate insulating film 606 which belongs to the sense IGBT cell 602 have the relation $t_{OXM} > t_{OXS}$. Therefore, the gate-collector capacitance Cgc is larger in the sense IGBT cell 602 than in the main IGBT cell 601. The gate insulating film 606 is formed of oxide, for example.

The emitter electrode 608 and the gate electrode 607a, and the sensing electrode 609 and the gate electrode 607b are both electrically insulated by the interlayer insulating film 610 formed of oxide or the like. Thus, in the CS-IGBT 600, there is no characteristic difference between the main IGBT cell 601 and the sense IGBT cell 602 except that the distances between the two kinds of gate electrodes 607a and 607b and the n semiconductor layer 2 are different. Accordingly, both the gate-emitter capacitance Cge and the gate resistance Rg have no special difference between the two IGBT cells.

As a result, as shown by the expression 2, the gate input capacitance Cies is larger in the sense IGBT cell 602 than in the main IGBT cell 601. Therefore, since there is no difference in the gate resistance Rg, the rise time $t_{rise}$ differs between the two IGBT cells as given by the expression 1. That is to say, the rise time $t_{rise}$ is larger in the sense IGBT cell 602 than in the main IGBT cell 601.

As a result, the sensing current Is rises more slowly as compared with the main circuit current Im. That is, in the turn-on period, the changes in time of the gate voltage $V_{GEM}$ of the main IGBT cell 601, the gate voltage $V_{GES}$ of the sense IGBT cell 602, the main circuit current Im and the sensing current Is are shown in the timing chart of FIG. 12. Accordingly, the surge current ΔIsp does not appear in the sensing current Is.

Now, it is preferred that the ratio of the gate-collector capacitance Cgcm in the main IGBT cell 601 and the gate-collector capacitance Cgcs in the sense IGBT cell 602 is $0.5 \leq Cgcm/Cgcs \leq 0.9$. Accordingly, it can be said that the preferred ratio between the thicknesses of the gate insulating film 606 in the portion facing to the upper surface of the n semiconductor layer 2 is $0.5 \leq t_{OXS}/T_{OXM} \leq 0.9$.

<7. Seventh Preferred Embodiment>

In the following preferred embodiments, descriptions will be made on preferable methods of manufacturing the devices of the preferred embodiments described above. The manufacturing method of the seventh preferred embodiment is a method suitable for manufacturing the device 100 according to the first preferred embodiment. FIGS. 19–35 are manufacturing process diagrams illustrating the method of this preferred embodiment. Referring to these figures, the method of this preferred embodiment will now be described.

Figure 19A:
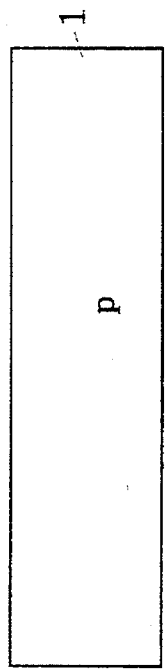
FIGS. 19A and 19B are a process diagram showing a manufacturing method according to the seventh preferred embodiment of the present invention.
Figure 19B:
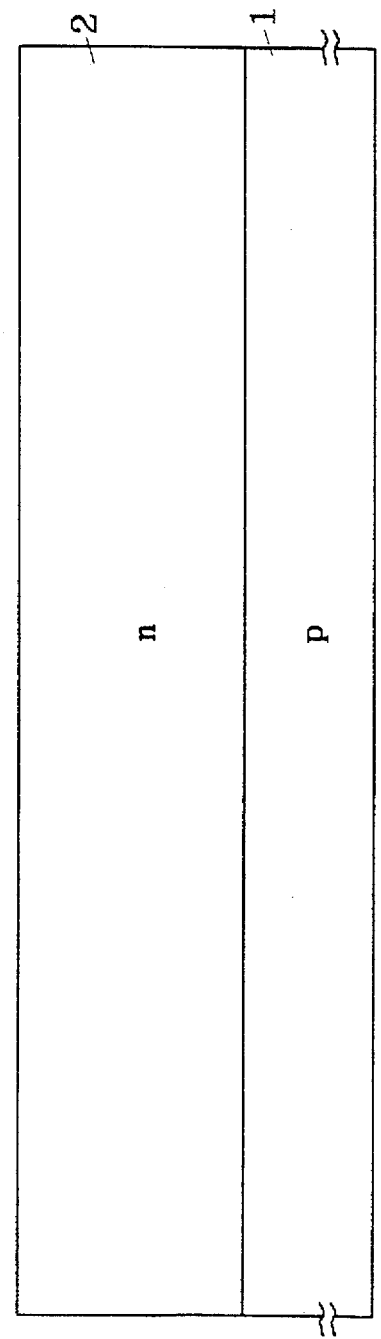

In producing the CS-IGBT 100, first, as shown in FIG. 19(a), a p-type silicon substrate corresponding to the p collector layer 1 is prepared. Next, as shown in FIG. 19(b), the n semiconductor layer 2 is formed by the epitaxial growth on the p collector layer 1. These p collector layer 1 and n semiconductor layer 2 form the semiconductor body 140. Note that only the n-type epitaxial layer 2 and the portion above it are shown in the following FIGS. 20–29.

Figure 20:
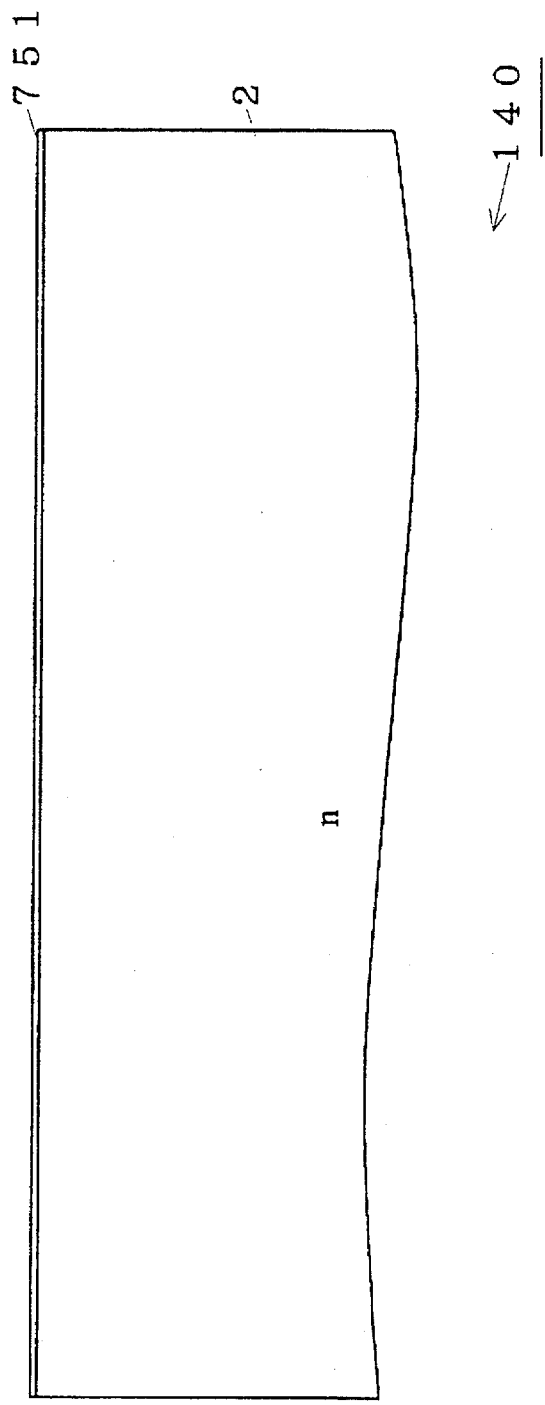
FIG. 20 is a process diagram showing the manufacturing method according to the seventh preferred embodiment of the present invention.

Next, as shown in FIG. 20, a silicon oxide film (oxide film) 751 is formed on the n semiconductor layer 2, that is, on the upper main surface of the semiconductor body 140.

Figure 21:
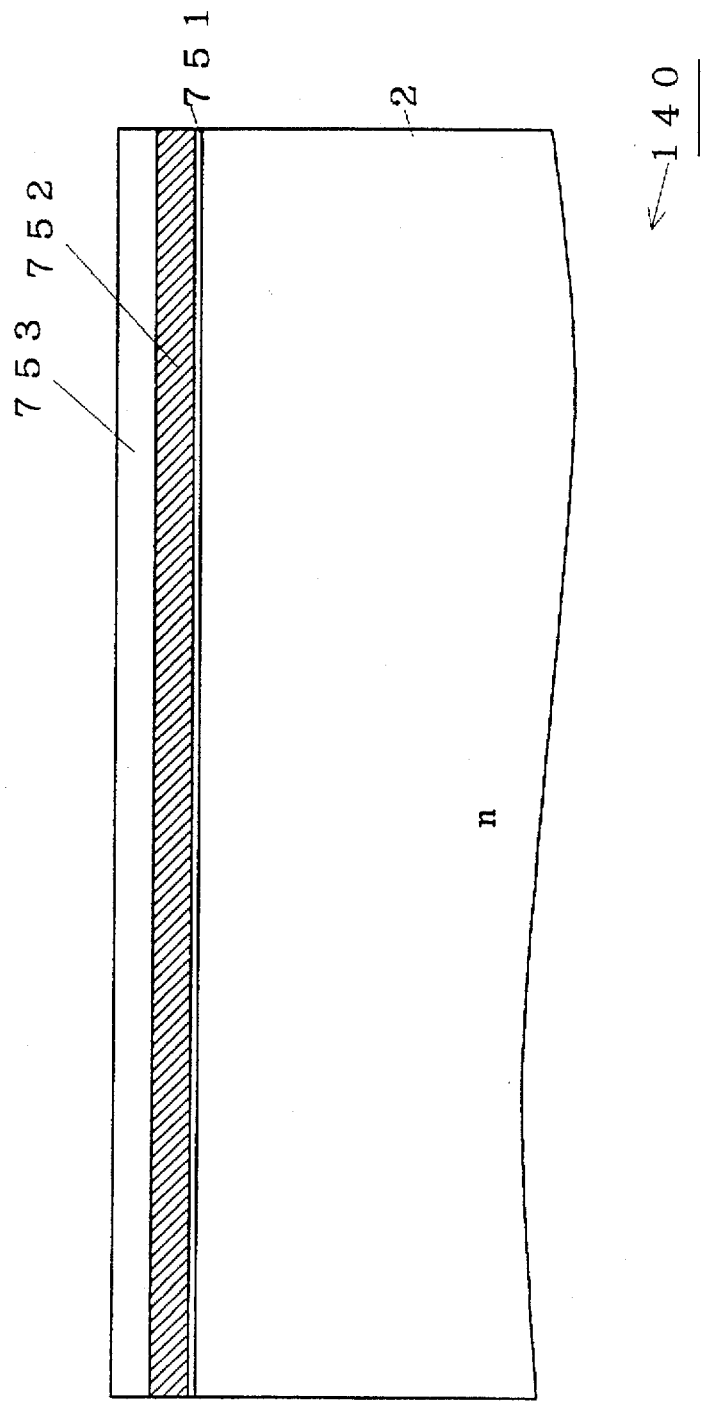
FIG. 21 is a process diagram showing the manufacturing method according to the seventh preferred embodiment of the present invention.

Next, as shown in FIG. 21, a polysilicon layer (conductive layer) 752 is formed on the silicon oxide film 751, and further a resist layer 753 is provided all over the polysilicon layer 752.

Figure 22:
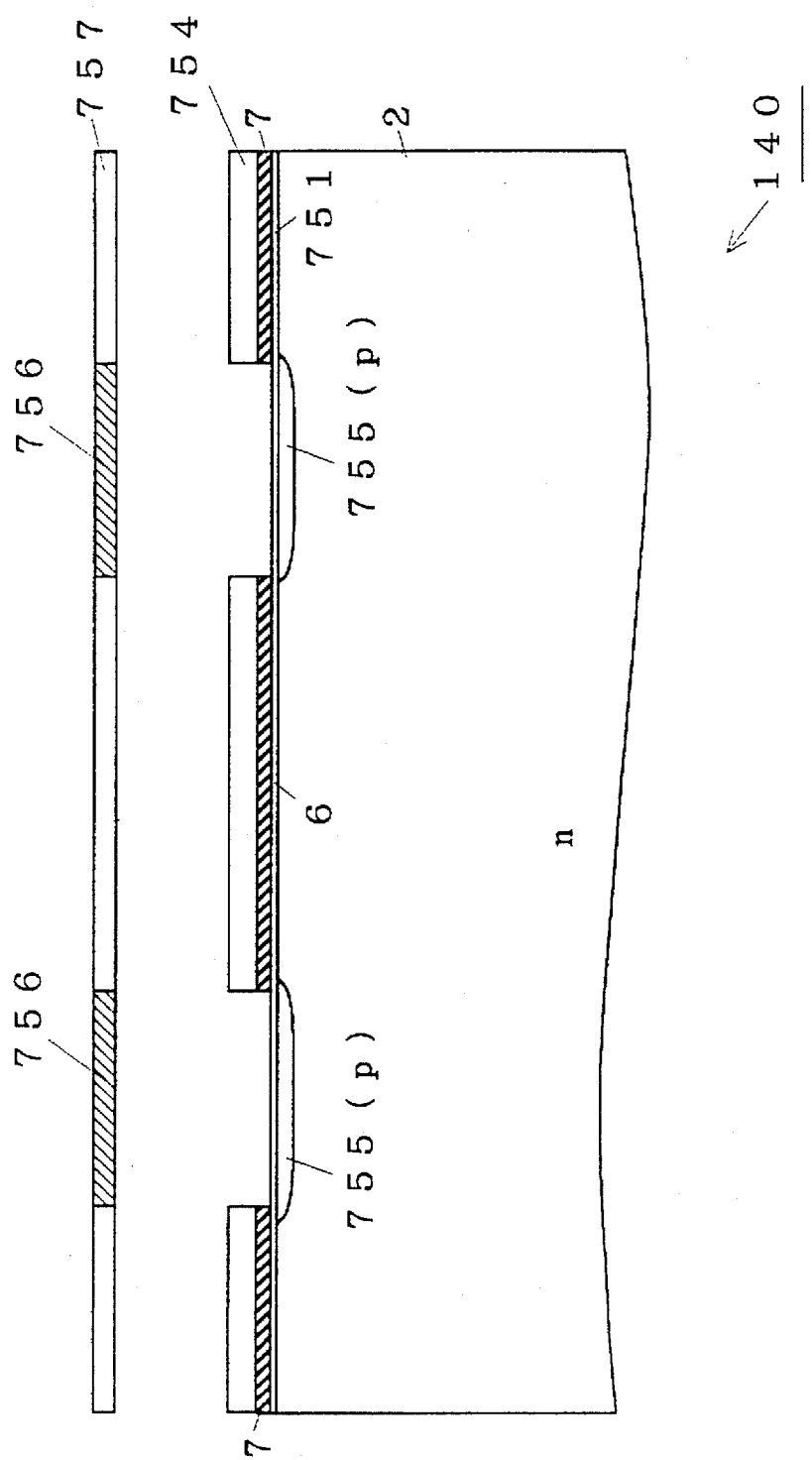
FIG. 22 is a process diagram showing the manufacturing method according to the seventh preferred embodiment of the present invention.

Next, as shown in FIG. 22, using a mask 757 defining a mask pattern 756, photolithography process of the resist layer 753 is carried out to obtain a resist pattern 754 corresponding to the mask pattern 756. Then, using the resist pattern 754 as a mask, the polysilicon layer 752 is selectively etched. The gate electrode 7 having openings (first openings) corresponding to the resist pattern 754 is thus formed on the silicon oxide film 751.

Subsequently, using the resist pattern 754 and the gate electrode 7 as masks, boron is selectively implanted into the n semiconductor layer 2 from above its upper surface. That is, boron is selectively introduced through the openings. This selectively forms p-type semiconductor regions 755 in the upper surface of the semiconductor layer 2. These p-type semiconductor regions 755 are formed at the same time in the regions corresponding to both the main IGBT cell and the sense IGBT cell.

Figure 23:
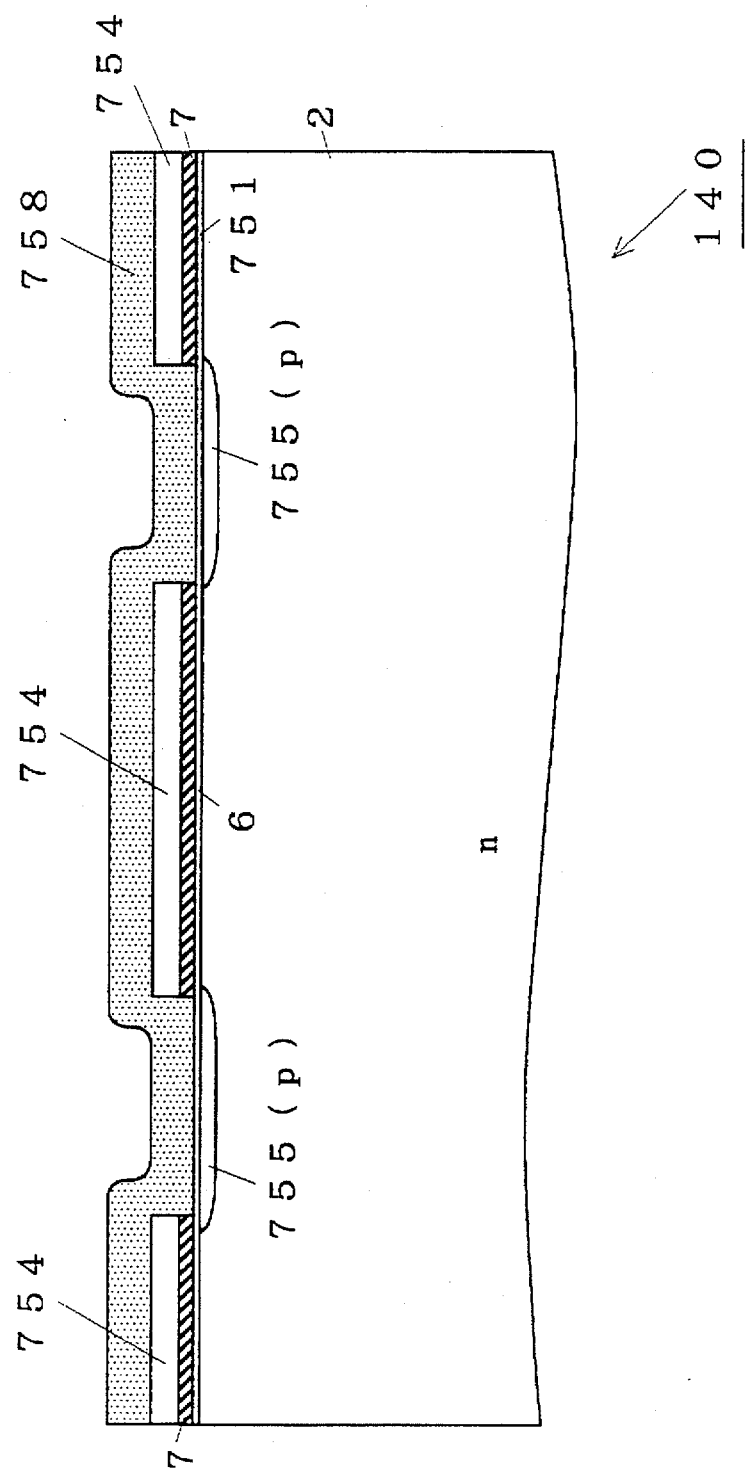
FIG. 23 is a process diagram showing the manufacturing method according to the seventh preferred embodiment of the present invention.

Next, as shown in FIG. 23, with the resist pattern 754 remaining, a resist layer 758 is provided all over on the resist pattern 754 and the semiconductor body 140.

Figure 24:
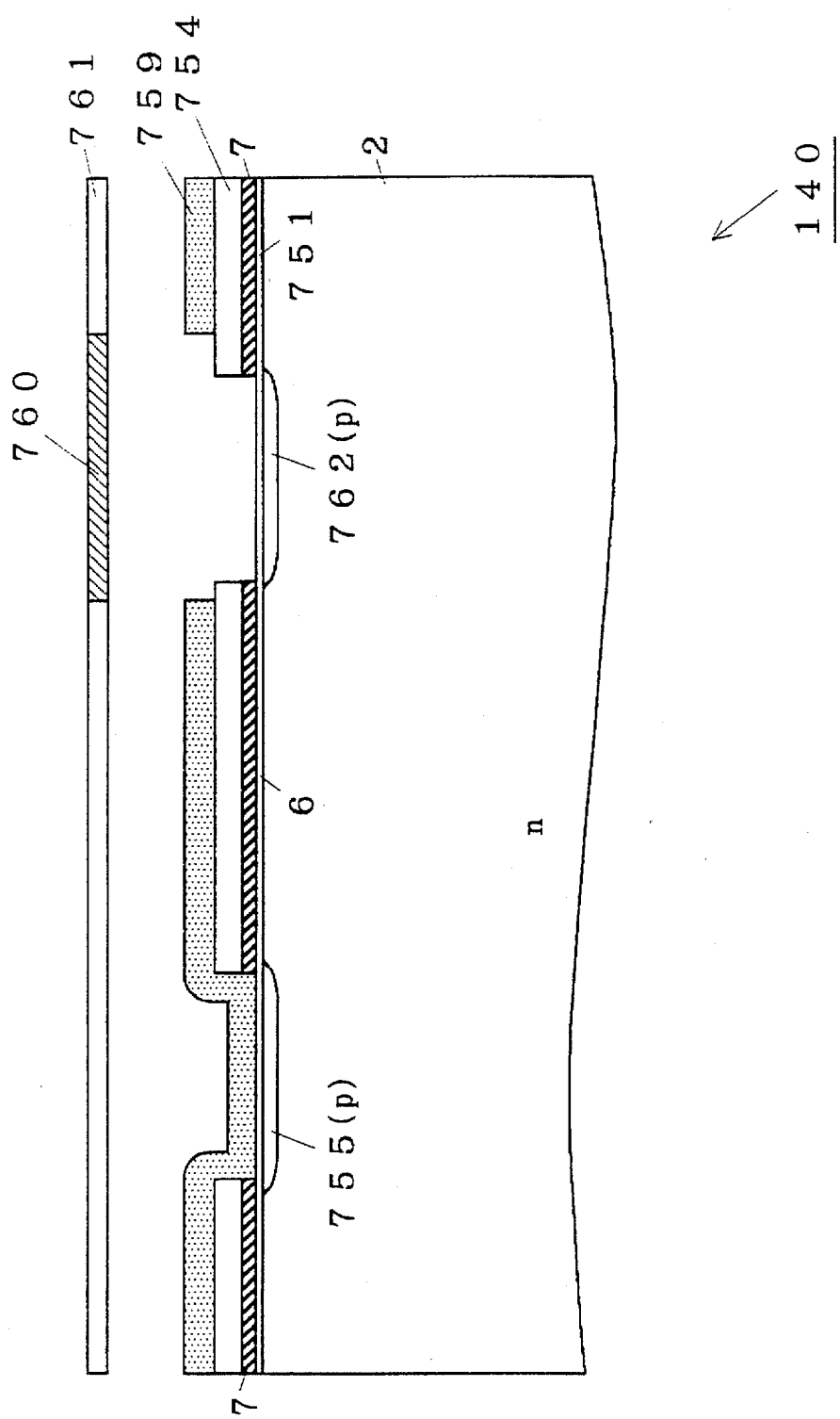
FIG. 24 is a process diagram showing the manufacturing method according to the seventh preferred embodiment of the present invention.

Subsequently, as shown in FIG. 24, using a mask 761 defining a mask pattern 760, the photolithography process of the resist layer 758 is carried out to obtain a resist pattern (shield film) 759 corresponding to the mask pattern 760. The mask pattern 760 is formed so as to cover only the opening of the gate electrode 7 in the region corresponding to the sense IGBT cell (the opening on the right side in FIG. 24). Accordingly, the resist pattern 759 opens only in the opening of the gate electrode 7 in the region corresponding to the sense IGBT cell.

Next, boron is selectively introduced again onto the upper surface of the n semiconductor layer 2 using the resist pattern 759 as a mask. As a result, since boron is introduced again only in the p-type semiconductor region 755 in the region corresponding to the sense IGBT cell, a p-type semiconductor region 762 with impurity concentration higher than that of the p-type semiconductor region 755 is formed only in the region corresponding to the sense IGBT cell.

Figure 25:
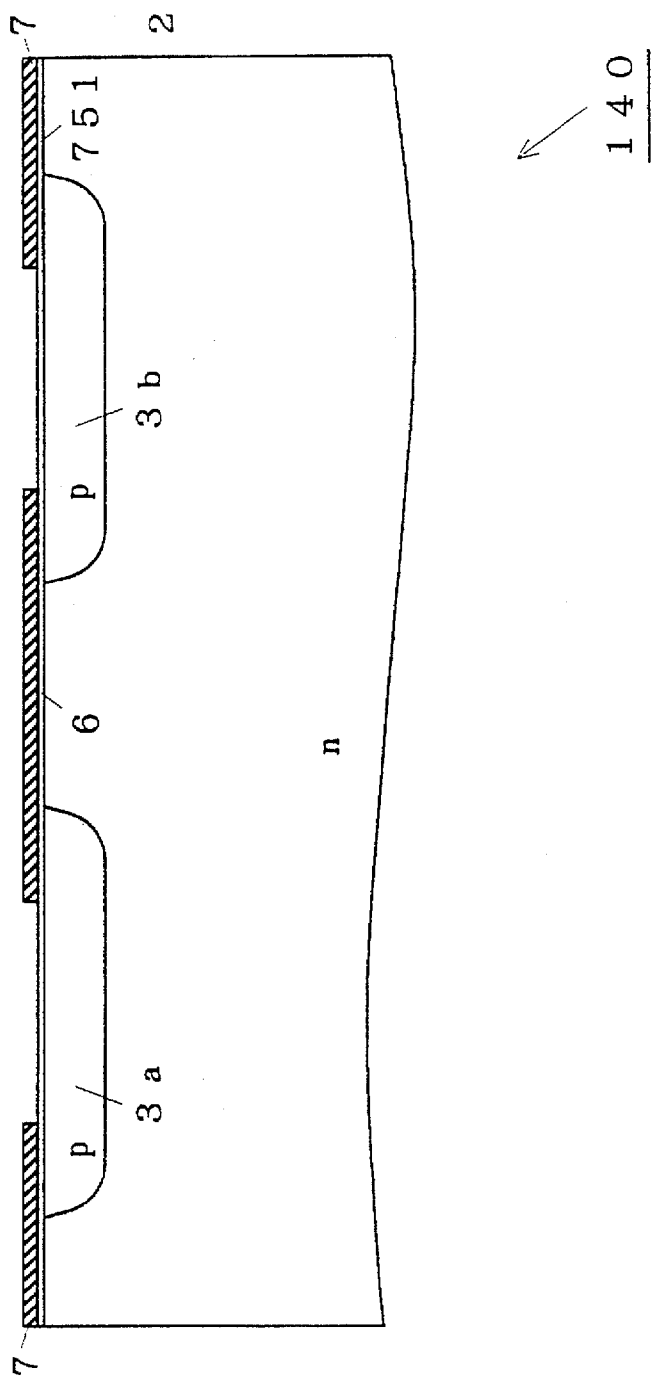
FIG. 25 is a process diagram showing the manufacturing method according to the seventh preferred embodiment of the present invention.

Next, as shown in FIG. 25, removing the resist pattern 754 and the resist pattern 759, boron in the p-type semiconductor region 755 and the p-type semiconductor region 762 is diffused to invade right under the gate electrode 7 by the drive process to obtain the p base layer 3a and the p base layer 3b.

Figure 26:
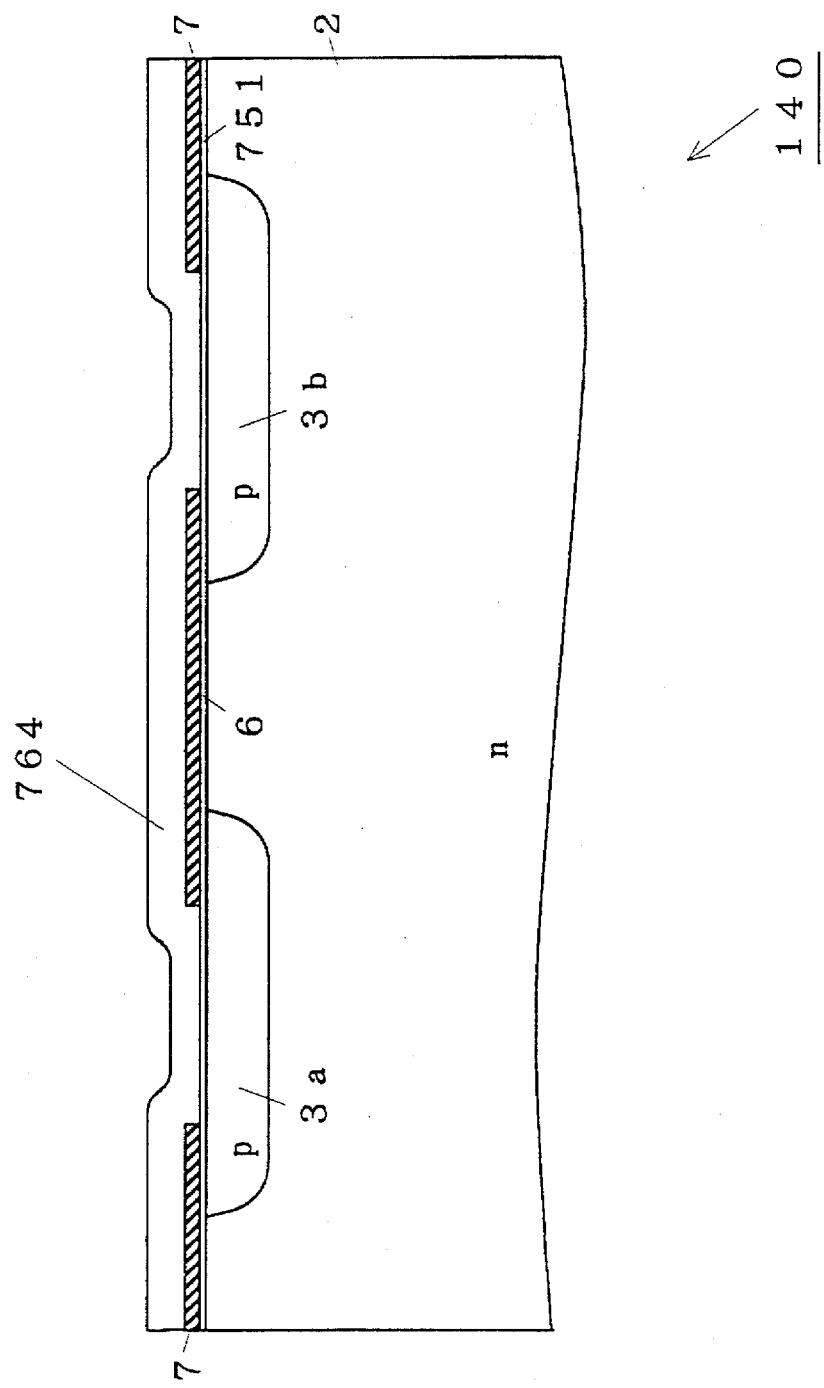
FIG. 26 is a process diagram showing the manufacturing method according to the seventh preferred embodiment of the present invention.

Next, as shown in FIG. 26, a resist layer 764 is provided on the entire surface of the gate electrode 7 and the silicon oxide film 751.

Figure 27:
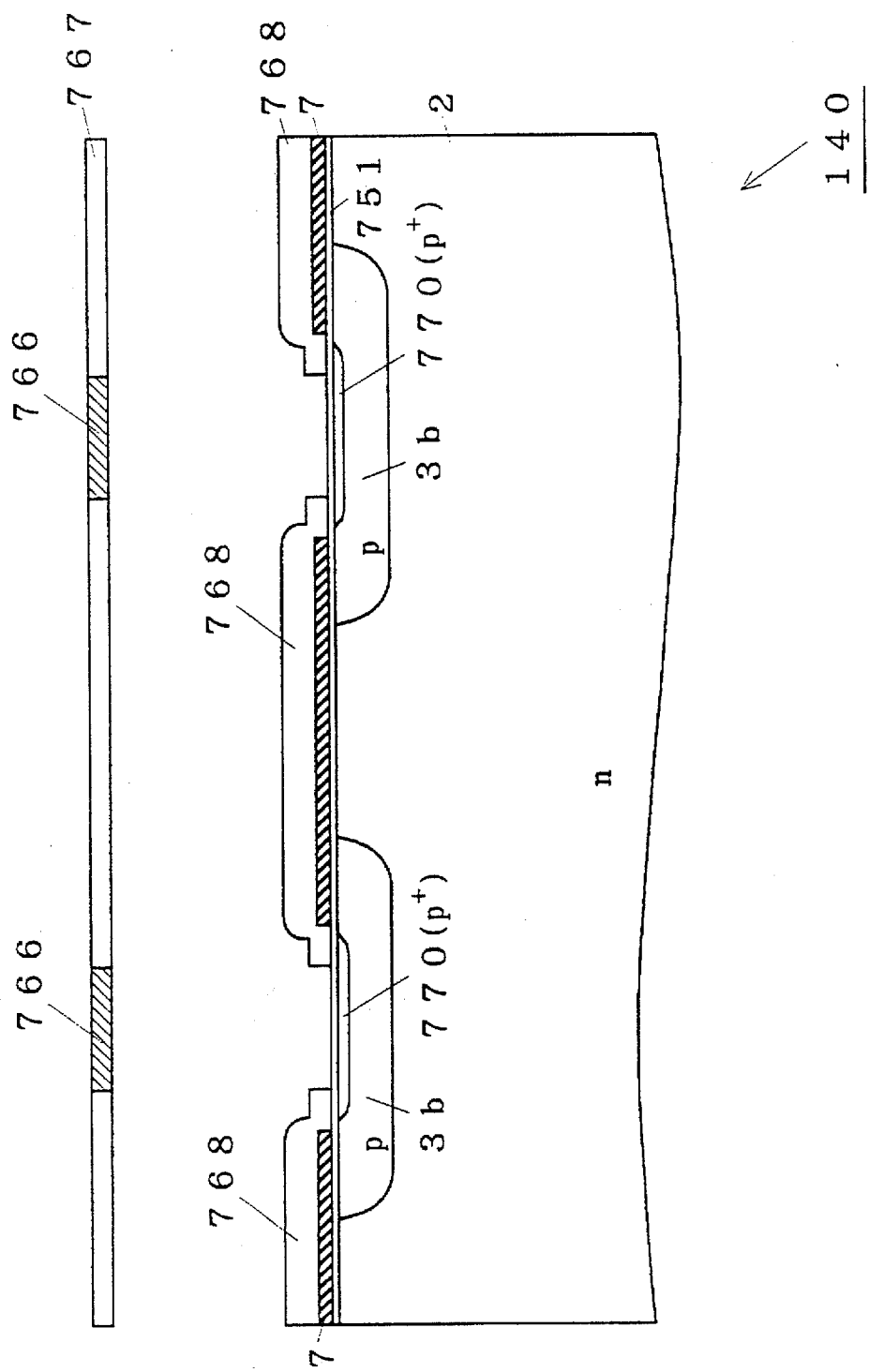
FIG. 27 is a process diagram showing the manufacturing method according to the seventh preferred embodiment of the present invention.

Subsequently, as shown in FIG. 27, the photolithography process of the resist layer 764 is carried out using a mask 767 defining a mask pattern 766 to obtain a resist pattern 768 having openings corresponding to the mask pattern 766. These openings are positioned inside the openings of the gate electrode 7.

Subsequently, using the resist pattern 768 and the gate electrode 7 as masks, boron with a high concentration is selectively implanted into the p base layer 3a and the p base layer 3b from above to selectively form $p^+$ semiconductor layers 770 in the upper surfaces of the p base layer 3a and the p base layer 3b.

Figure 28:
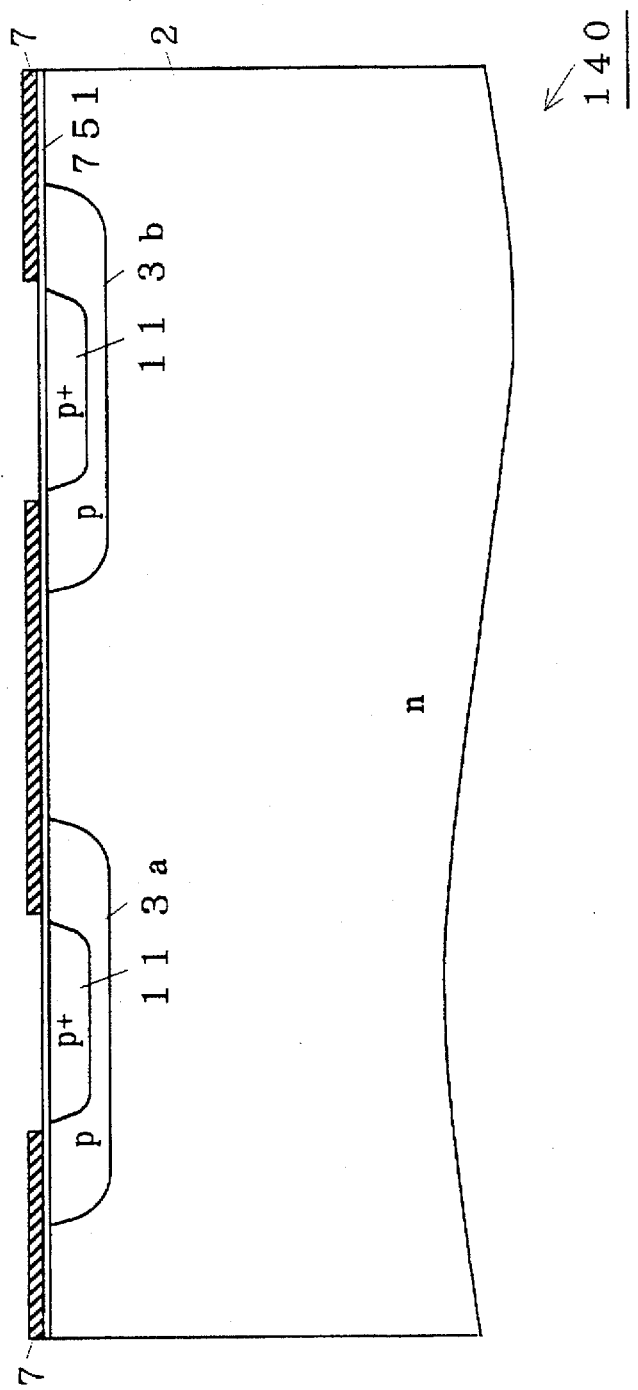
FIG. 28 is a process diagram showing the manufacturing method according to the seventh preferred embodiment of the present invention.

Next, as shown in FIG. 28, after removing the resist pattern 768, boron in the $p^+$ semiconductor layers 770 is diffused by the drive process to obtain the $p^+$ semiconductor layers 11. As shown in FIG. 28, the progress of the drive process is adjusted so that the $p^+$ semiconductor layer 11 does not spread outside the opening of the gate electrode 7.

Figure 29:
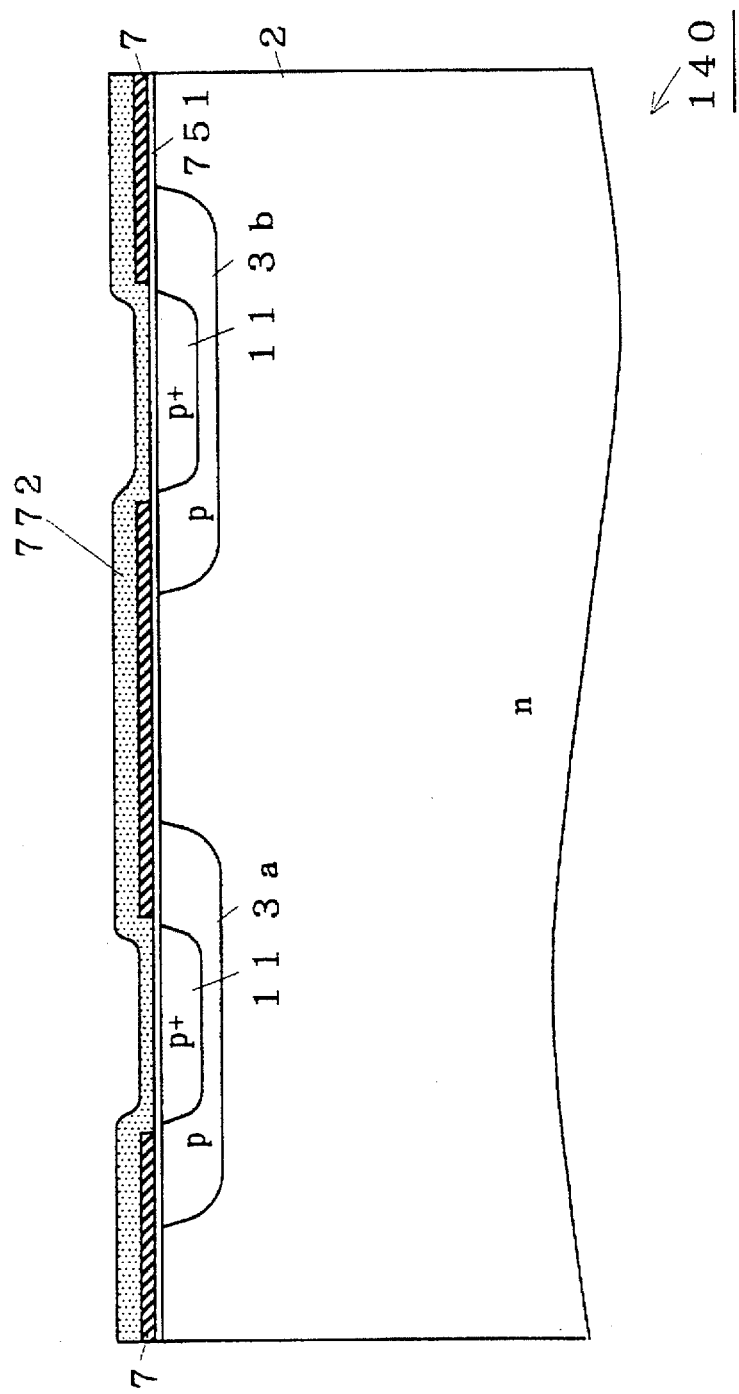
FIG. 29 is a process diagram showing the manufacturing method according to the seventh preferred embodiment of the present invention.

Next, as shown in FIG. 29, a resist layer 772 is provided on the entire upper surface of the gate electrode 7 and the silicon oxide film 751.

Figure 30:
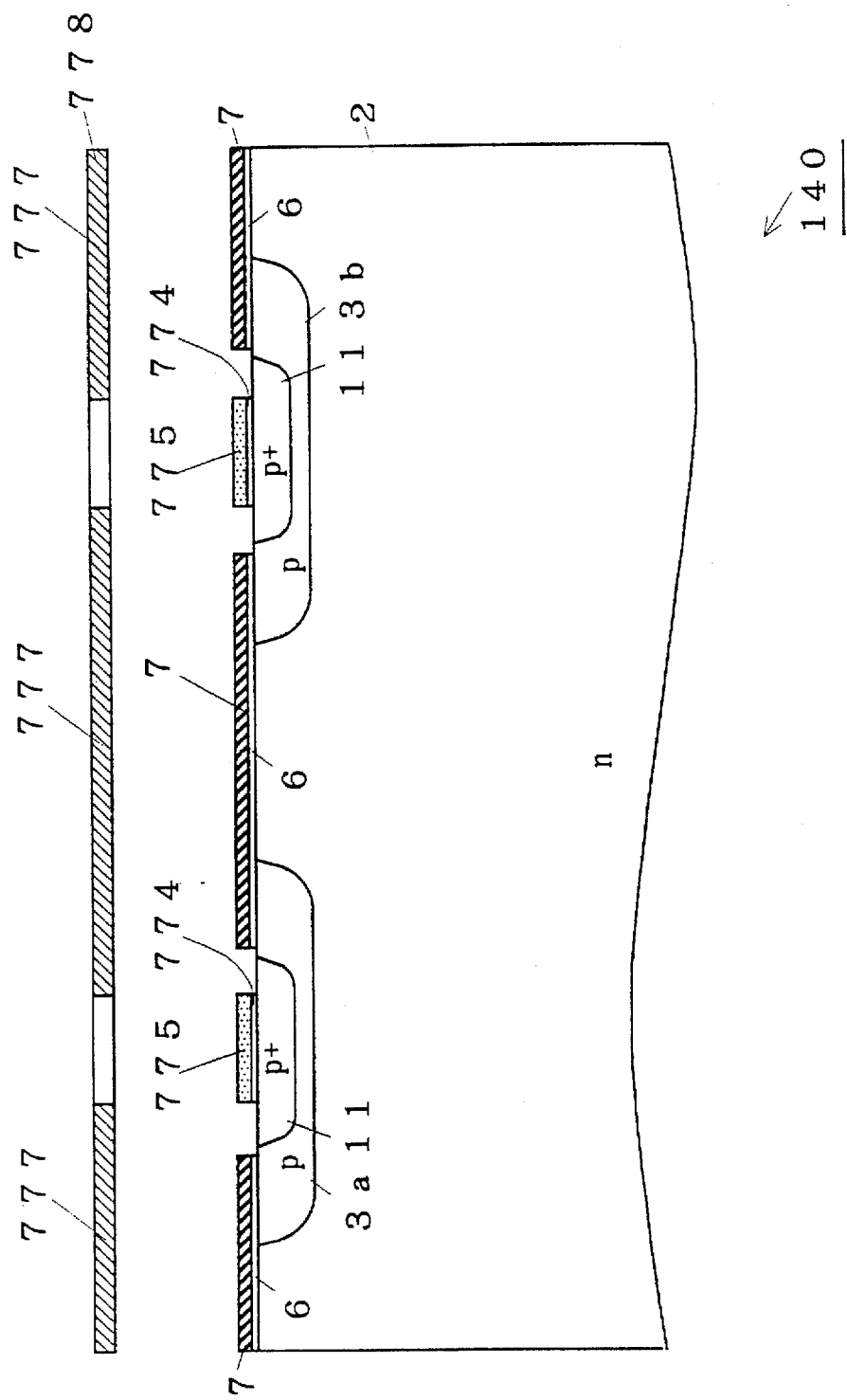
FIG. 30 is a process diagram showing the manufacturing method according to the seventh preferred embodiment of the present invention.

Next, as shown in FIG. 30, the photolithography process of the resist layer 772 is carried out by using a mask 778 defining a mask pattern 777 to obtain a resist pattern 775 corresponding to the mask pattern 777. This resist pattern 775 exists only in the center regions of the openings of the gate electrode 7.

Subsequently, the silicon oxide film 751 is selectively etched using the resist pattern 775 and the gate electrode 7 as a mask. Thus, the gate insulating film 6 having openings the same as those of the gate electrode 7 and an oxide film pattern 774 located in the center regions of the openings are obtained.

Figure 31:
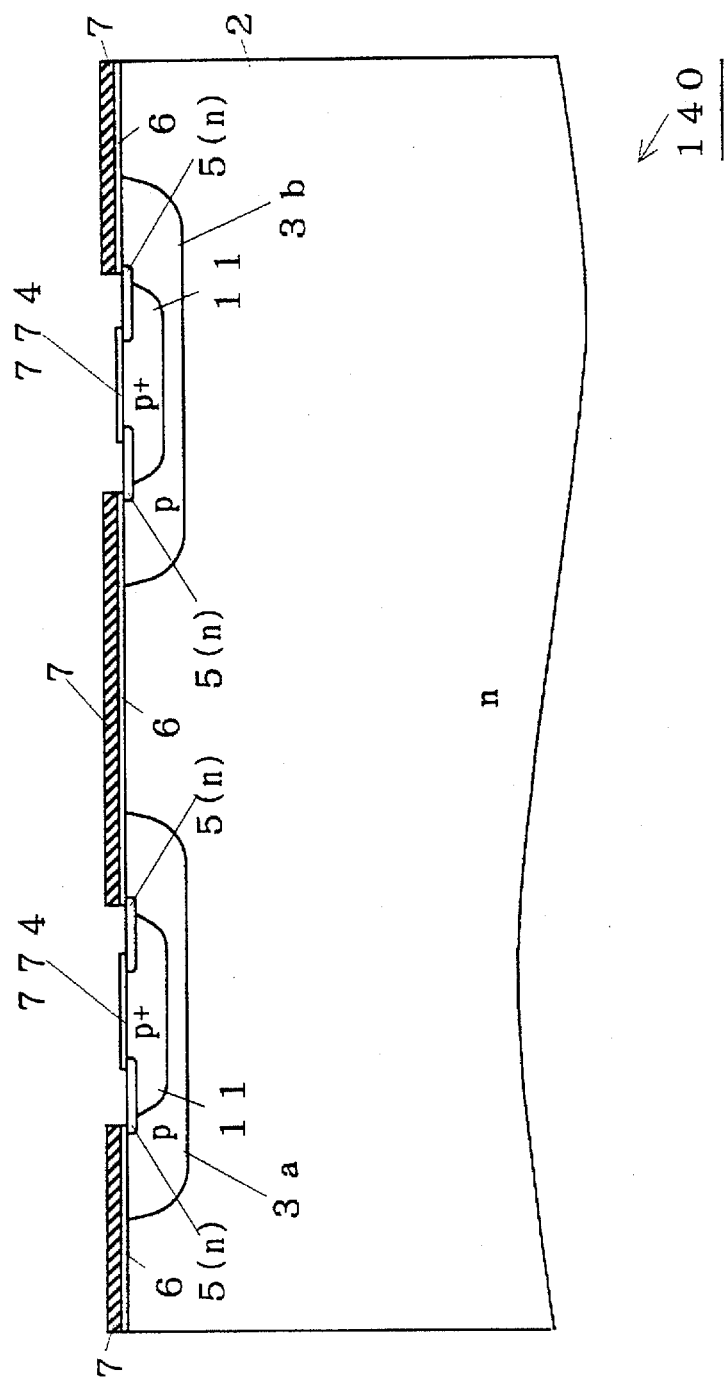
FIG. 31 is a process diagram showing the manufacturing method according to the seventh preferred embodiment of the present invention.

Next, as shown in FIG. 31, after removing the resist pattern 775, using the oxide pattern 774, the gate insulating film 6, and the gate electrode 7 as masks, arsenic is selectively implanted onto the upper surface of the $p^+$ semiconductor layers 11. This selectively forms the n emitter layers 5 in the upper surfaces of the p base layers 3a and 3b. That is, the n emitter layer 5 is formed in the opening of the gate electrode 7 excluding the oxide film pattern 774 or in a some wider region.

Figure 32:
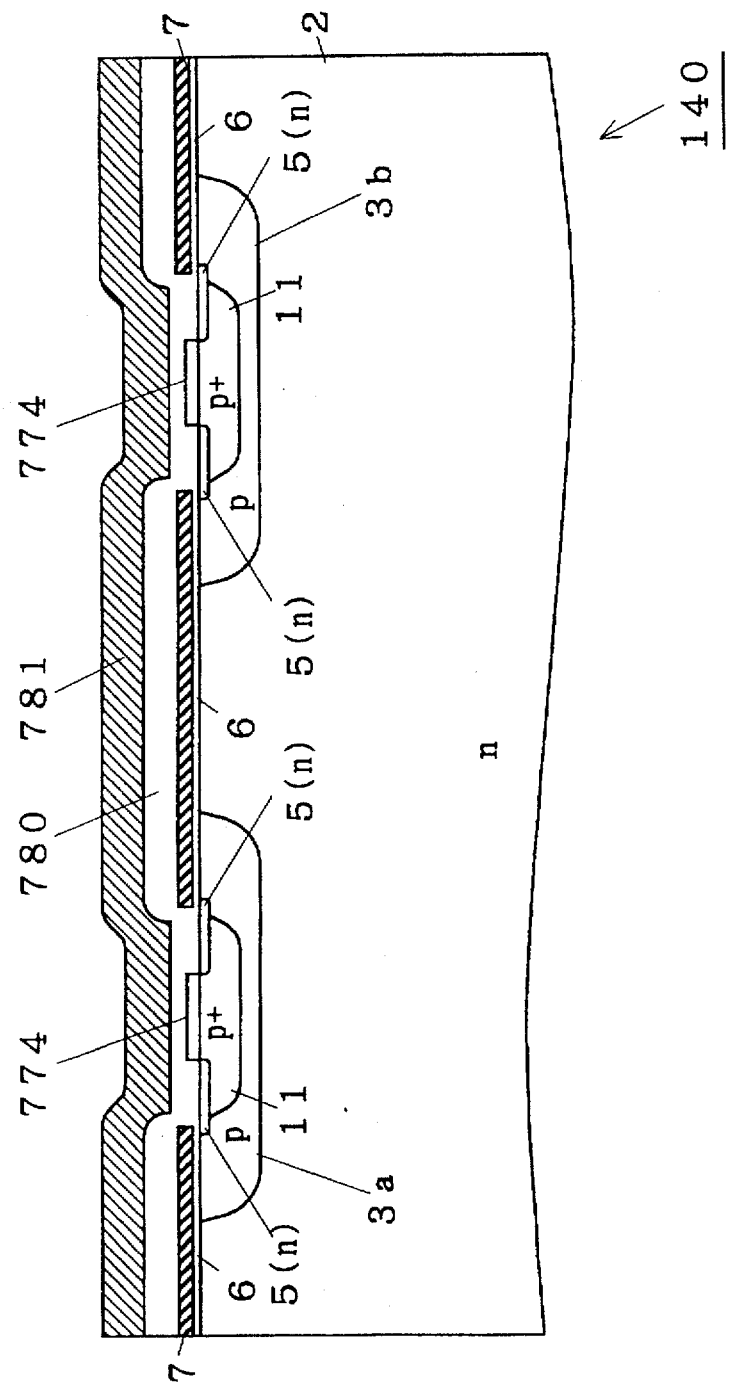
FIG. 32 is a process diagram showing the manufacturing method according to the seventh preferred embodiment of the present invention.

Next, as shown in FIG. 32, a relatively thick silicon oxide film 780 is provided all over the upper surface of the structure obtained after the preceding process has finished. After that, a resist layer 781 is provided all over the upper surface of the silicon oxide film 780.

Figure 33:
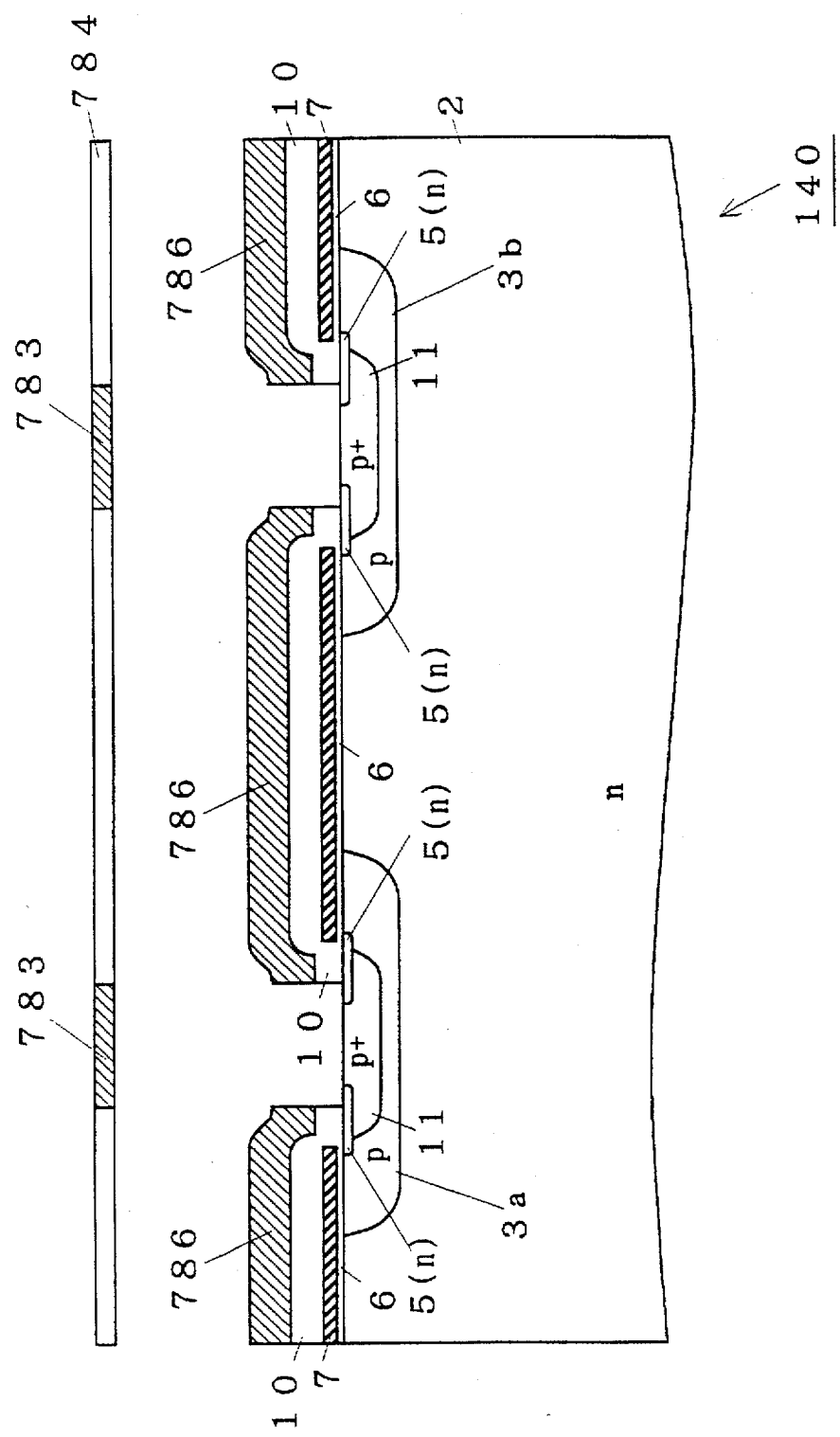
FIG. 33 is a process diagram showing the manufacturing method according to the seventh preferred embodiment of the present invention.

Next, as shown in FIG. 33, the photolithography process of the resist layer 781 is carried out using a mask 784 defining a mask pattern 783 to obtain a resist pattern 786 corresponding to the mask pattern 783. After that, etching is performed using the resist pattern 786 as a mask to selectively remove the silicon oxide film 780 and also to remove the oxide film 774. Thus the interlayer insulating film 10 is obtained. The silicon oxide film 10 has openings (second openings) corresponding to the resist pattern 786. These openings are located inside the openings of the gate electrode 7 with their opening ends being located on the n emitter layers 5.

Figure 34:
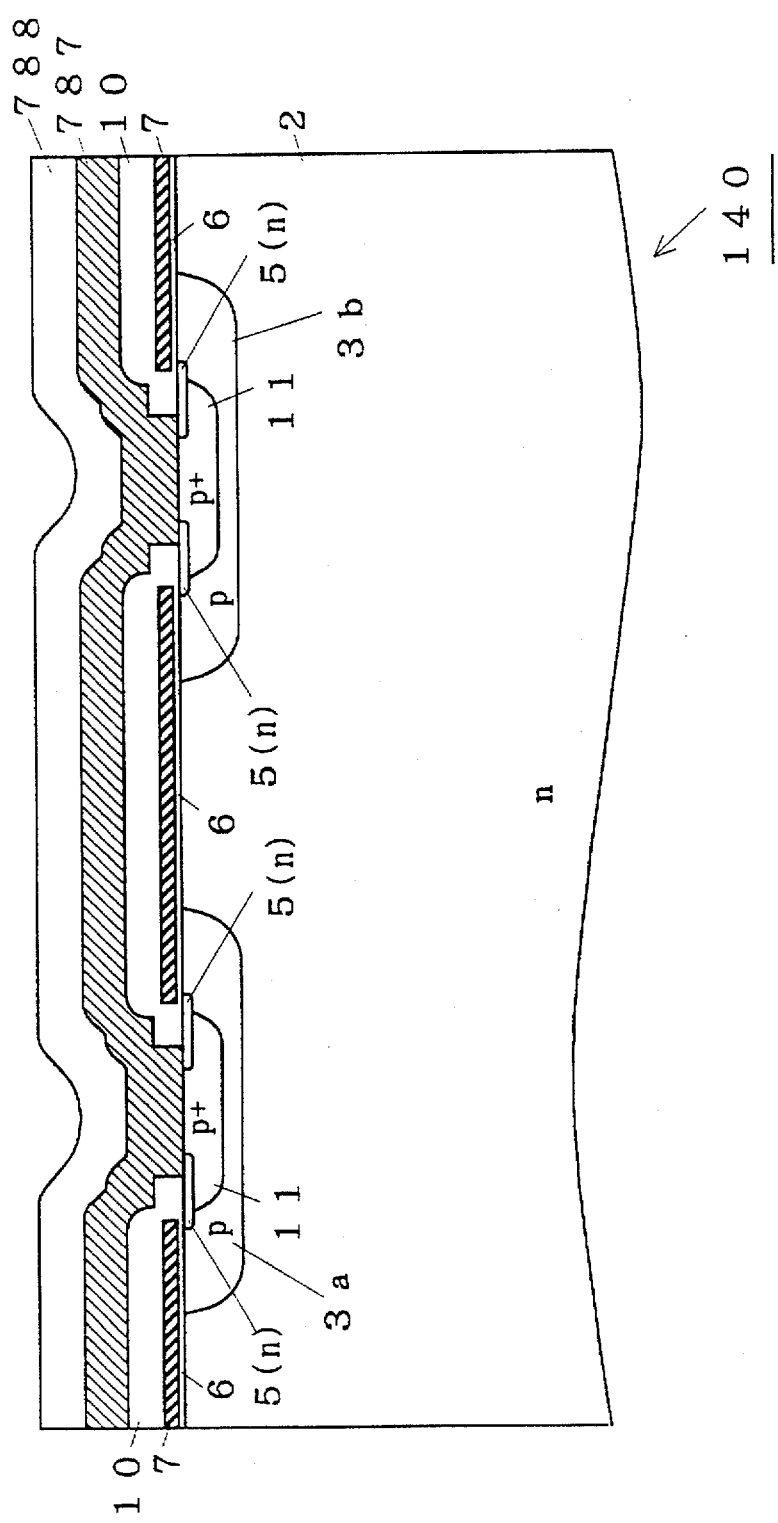
FIG. 34 is a process diagram showing the manufacturing method according to the seventh preferred embodiment of the present invention.

Next, as shown in FIG. 34, after removing the resist pattern 786, an aluminum layer 787 is formed covering the entire upper surface of the obtained structure, in other words, covering the exposed surface of the interlayer insulating film 10 and the semiconductor body 140. Subsequently, a resist layer 788 is provided all over the upper surface of the aluminum layer 787.

Figure 35:
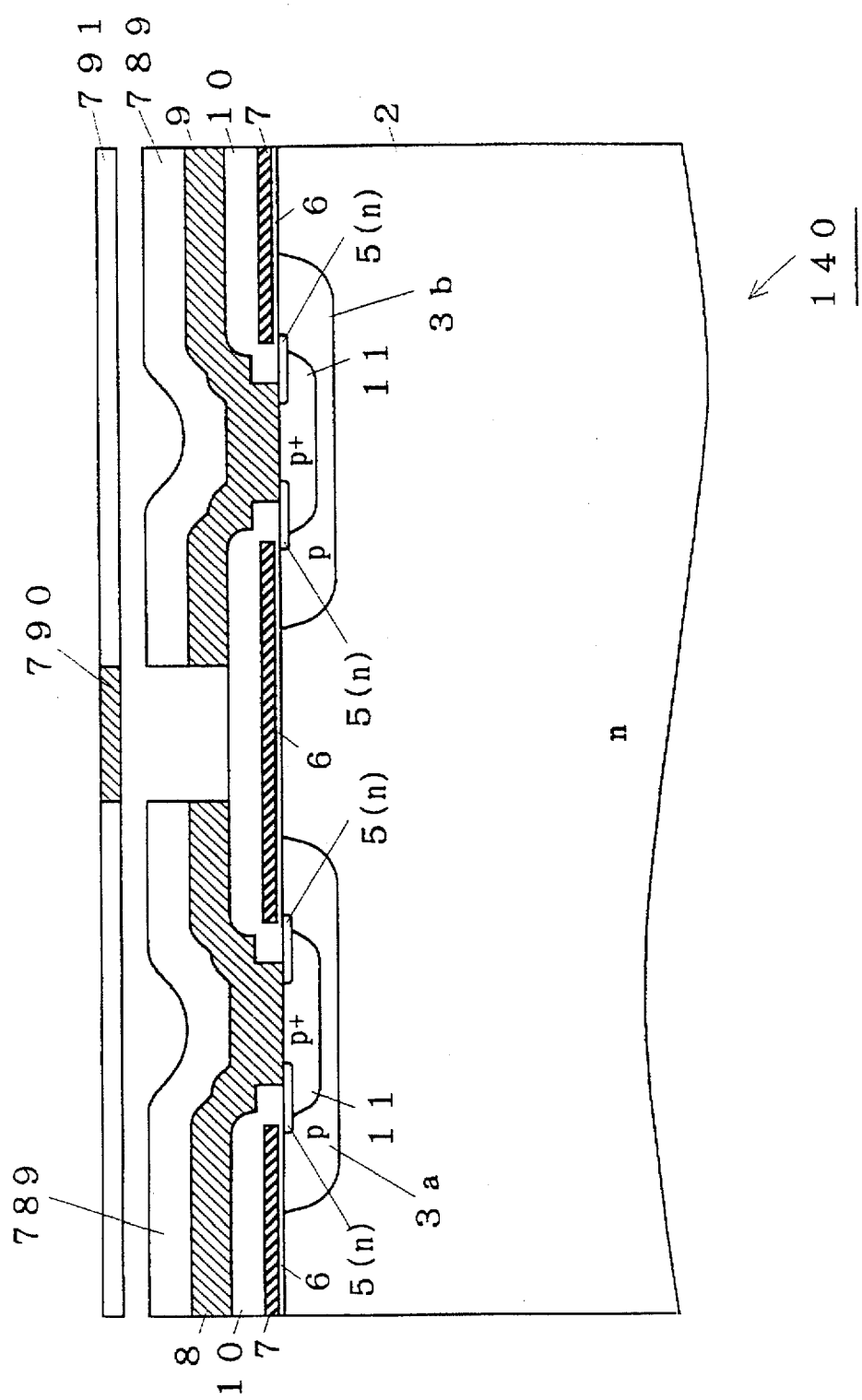
FIG. 35 is a process diagram showing the manufacturing method according to the seventh preferred embodiment of the present invention.

Next, as shown in FIG. 35, the photolithography process of the resist layer 788 is carried out using a mask 791 defining a mask pattern 790 to obtain a resist pattern 789 corresponding to the mask pattern 790. The aluminum layer 787 is selectively etched using the resist pattern 789 as a mask to obtain the emitter electrode 8 and the sensing electrode 9.

That is to say, the emitter electrode 8 which belongs to the main IGBT cell and the sensing electrode 9 which belongs to the sense IGBT are separated by this process. Both the emitter electrode 8 and the sensing electrode 9 are in contact with both the $p^+$ semiconductor layers 11 and the emitter layers 5 to be electrically connected with them.

Next, after removing the resist pattern 789, returning to FIG. 8, an Al—Mo—Ni—Au film is formed over the entire lower surface of the semiconductor body 140, i.e., all over the lower surface of the p collector layer 1 to obtain the collector electrode 12.

The CS-IGBT 100 shown in FIG. 8 is obtained by the processes described above.

<8. Eighth Preferred Embodiment>

Next, a method of manufacturing according to the eighth preferred embodiment will be described. This method of manufacturing is suitable for the manufacturing of the device 200 of the second preferred embodiment.

When manufacturing the CS-IGBT 200, first, the processes shown in FIGS. 19 to 22 are performed. Subsequently, without performing the processes shown in FIG. 23 and FIG. 24, it moves to the process shown in FIG. 25. That is, the p base layer 3a and the p base layer 3b are formed as p base layers 3 with the same structure.

Figure 36:
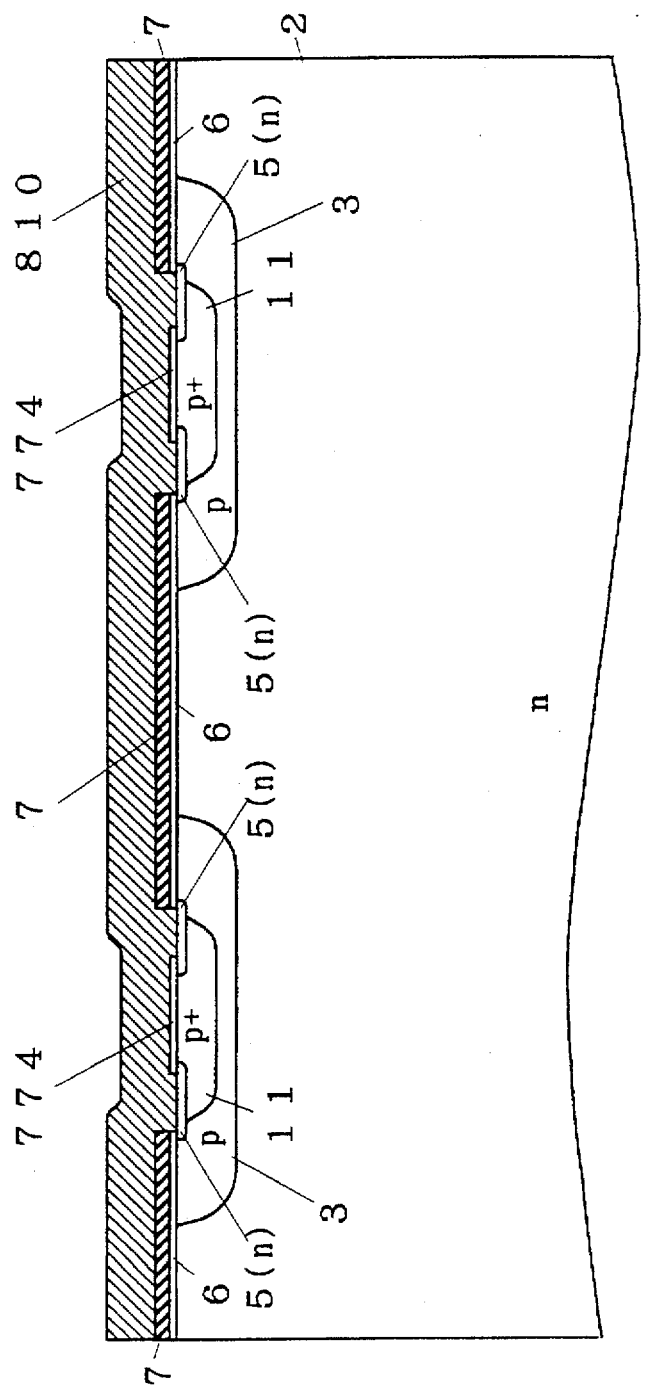
FIG. 36 is a process diagram showing a manufacturing method according to the eighth preferred embodiment of the present invention.

After that, the processes shown in FIGS. 26 to 31 are carried out to obtain the p⁺ semiconductor layers 11 and the n emitter layers 5. Subsequently, as shown in FIG. 36, a resist layer 810 is provided all over the obtained structure.

Figure 37:
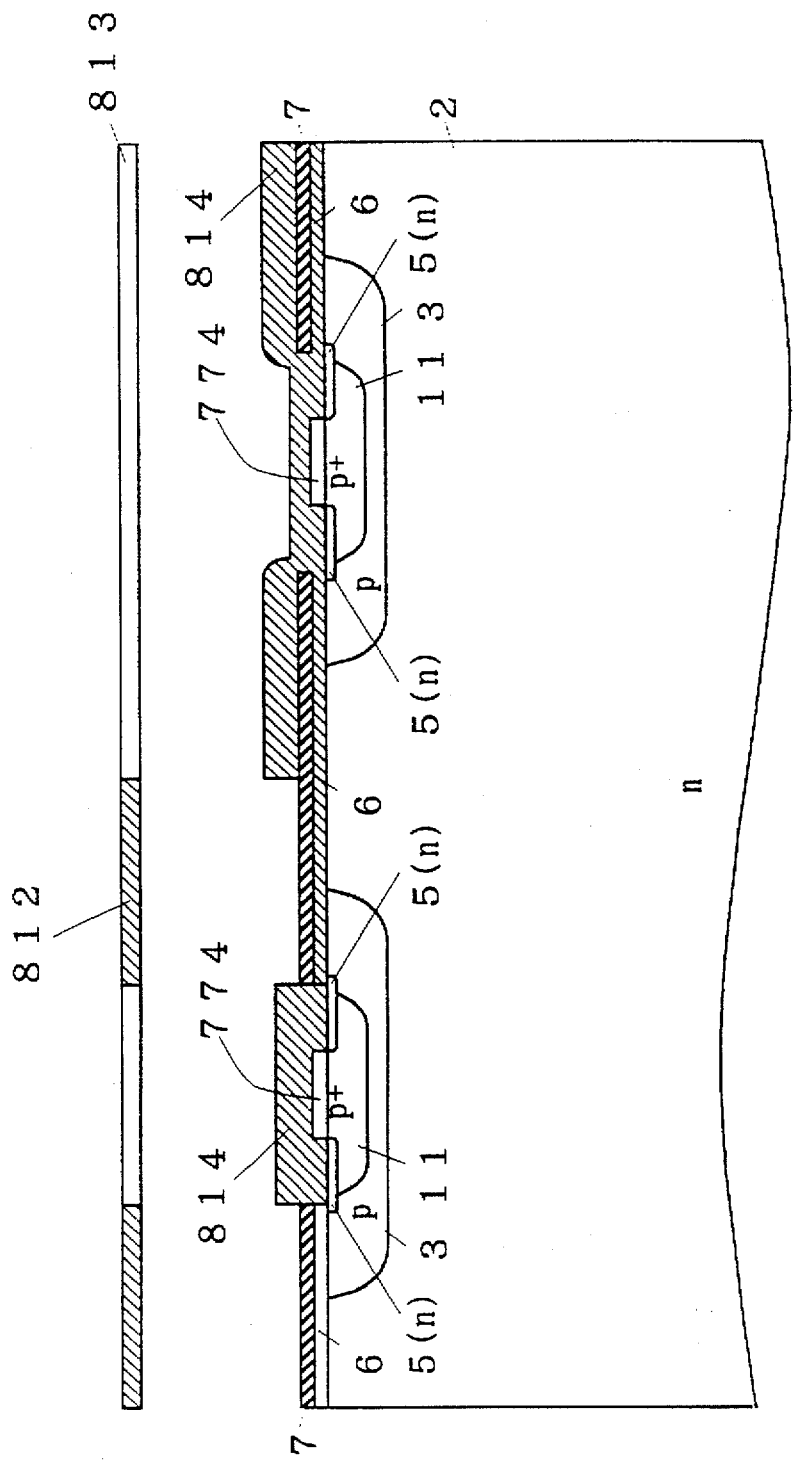
FIG. 37 is a process diagram showing the manufacturing method according to the eighth preferred embodiment of the present invention.

Next, as shown in FIG. 37, the photolithography process of the resist layer 810 is performed using a mask 813 defining a mask pattern 812 to obtain a resist pattern 814 corresponding to the mask pattern 812. This resist pattern 814 is formed as to selectively cover the entire region corresponding to the sense IGBT cell and the opening of the gate electrode 7 in the region corresponding to the main IGBT cell.

After that, the n-type impurity is introduced using the resist pattern 814 as a mask to selectively increase the concentration of impurity of the gate electrode 7 which belongs to the region corresponding to the main IGBT cell. This selectively lowers the sheet resistance of the gate electrode 7 which belongs to the main IGBT cell.

Next, the resist pattern 814 is removed and then the processes after FIG. 32 in the seventh preferred embodiment are carried out to obtain the CS-IGBT 200 shown in FIG. 10.

<9. Ninth Preferred Embodiment>

Next, a method of manufacturing according to the ninth preferred embodiment will be described. This method of manufacturing is suitable for the manufacturing of the device 600 of the sixth preferred embodiment.

Figure 38:
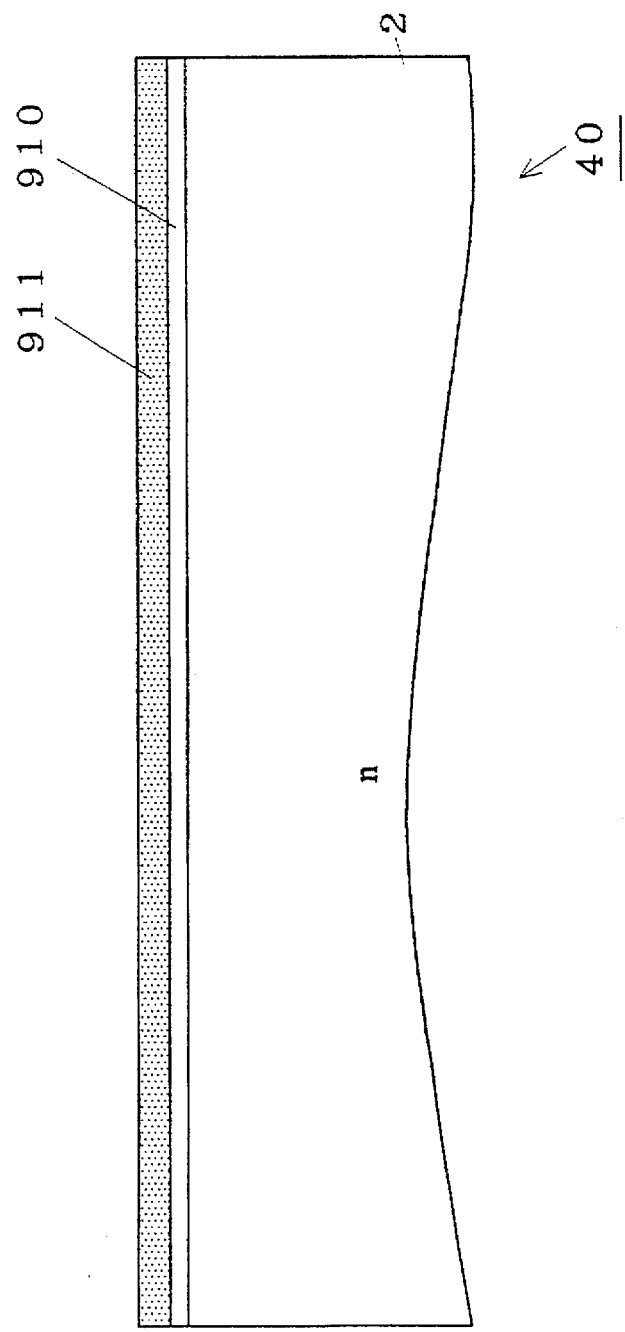
FIG. 38 is a process diagram showing a manufacturing method according to the ninth preferred embodiment of the present invention.

When manufacturing the CS-IGBT 600, first, the process shown in FIG. 19 is performed to obtain the semiconductor body 40. After that, as shown in FIG. 38, a silicon oxide film 910 is formed on the upper main surface of the obtained semiconductor body 40. This silicon oxide film 910 is preferably set to be thicker than the silicon oxide film 751 shown in FIG. 20. After that, a resist layer 911 is provided on the entire upper surface of the silicon oxide film 910.

Figure 39:
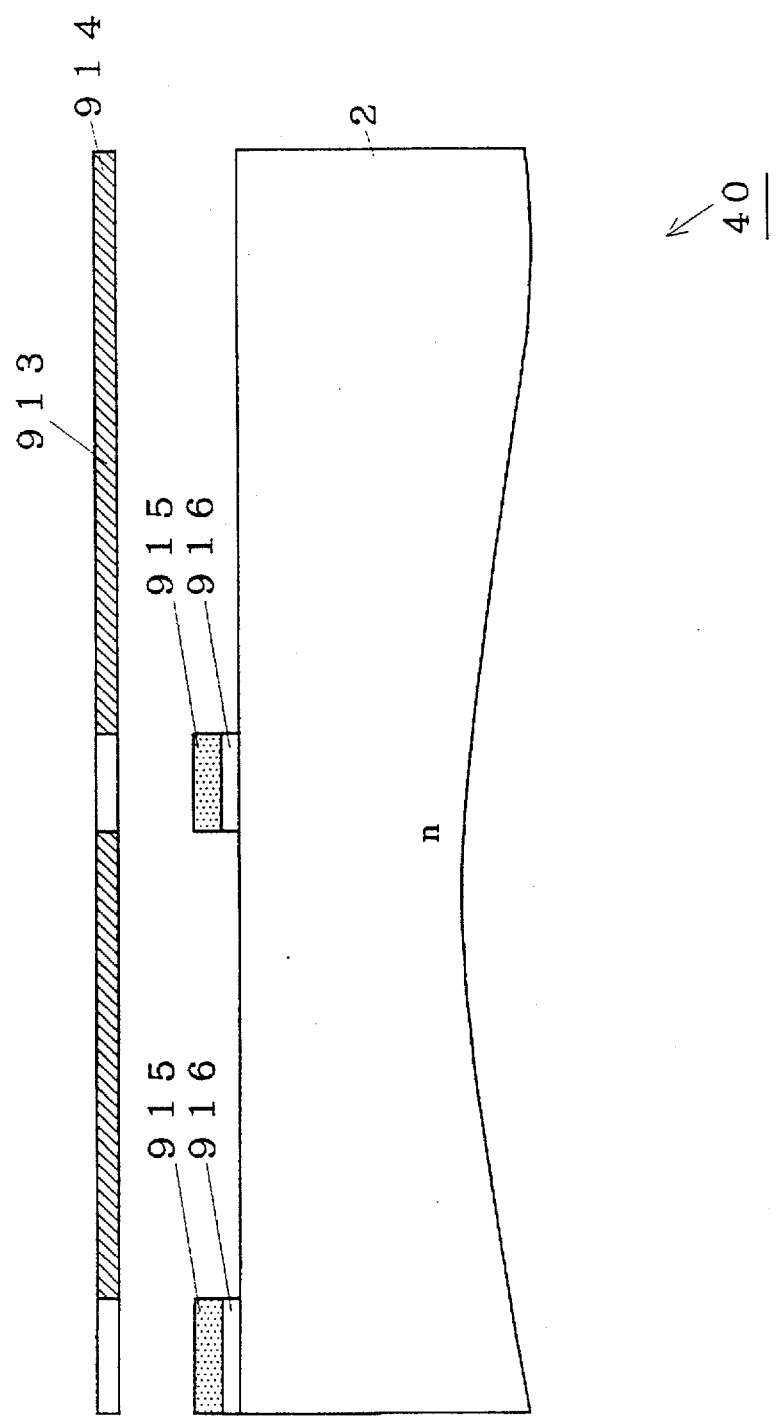
FIG. 39 is a process diagram showing the manufacturing method according to the ninth preferred embodiment of the present invention.

Next, as shown in FIG. 39, the photolithography process of the resist layer 911 is performed using a mask 914 defining a mask pattern 913 to obtain a resist pattern (shield film) 915 corresponding to the mask pattern 913. This resist pattern 915 is formed to selectively cover the region in which the p base layer 3 is not formed in the following process in the region corresponding to the main IGBT cell.

Subsequently, etching is conducted using the resist pattern 915 as a mask to selectively remove the silicon oxide film 910. Thus the silicon oxide film 910 selectively remains as a silicon oxide film (first oxide film) 916 right under the resist pattern 915.

Figure 40:
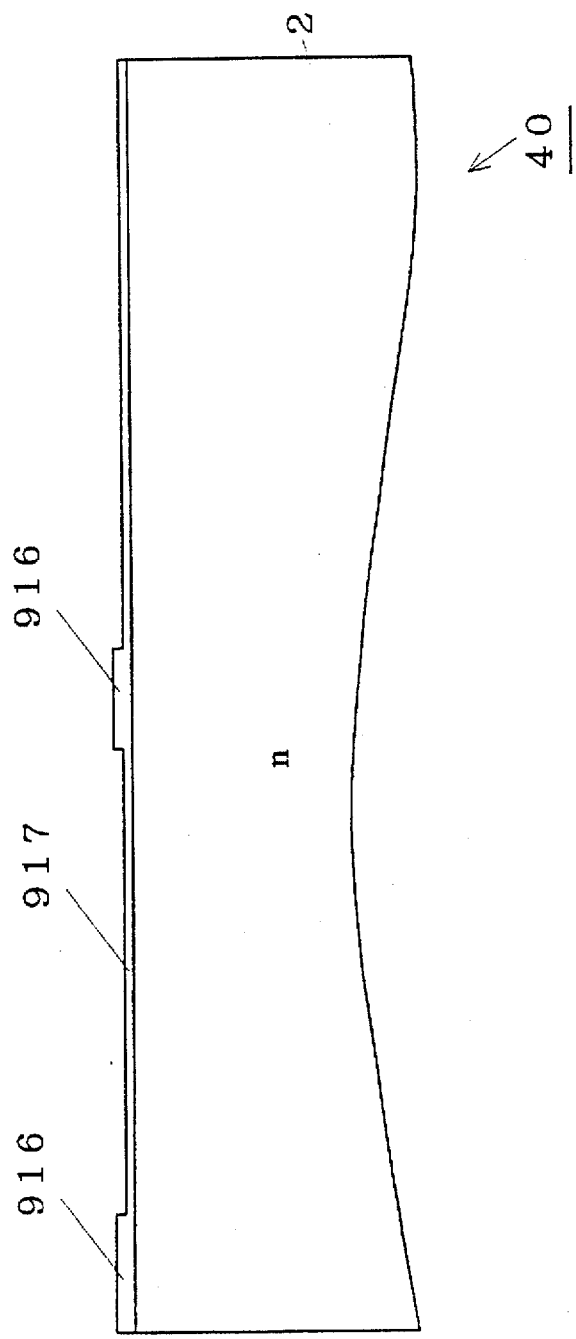
FIG. 40 is a process diagram showing the manufacturing method according to the ninth preferred embodiment of the present invention.

Next, as shown in FIG. 40, a silicon oxide film (second oxide film) 917 thinner than the silicon oxide film 916 is formed on the upper main surface of the semiconductor body 40. After that, these silicon oxide films 916 and 917 are treated as the silicon oxide film 715 and the semiconductor body 40 is treated as the semiconductor body 140 to perform the processes shown in FIG. 21 and FIG. 22.

Subsequently, without carrying out the processes shown in FIG. 23 and FIG. 24, it moves to the process shown in FIG. 25. That is, the p base layer 3a and the p base layer 3b are formed as the p base layers 3 with the same structure. After that, the processes after FIG. 26 in the seventh preferred embodiment are performed to obtain the CS-IGBT 600 shown in FIG. 18.

In the step shown in FIG. 38, the position where the silicon oxide film 910 selectively remains can be determined on the basis of a region (imaginary region) where the opening of the gate electrode 7 is to be provided which is assumed in advance. That is, it is appropriately determined around the opening which belongs to the main IGBT 601 considering the diffusion depth of the p base layer 3 from the open end of the opening, i.e., the channel length.

<10. Modified Examples>

(1) Although the description has been made on the IGBTs of the n-channel type in the preferred embodiments above, the same can be similarly implemented for IGBTs of the p-channel type to produce the same effects.

(2) Although the description has been made on IGBTs in the preferred embodiments above, the same can be implemented in the same way with respect to other field effect semiconductor devices, e.g., MOS transistors, thyristors and so on to produce the same effects.

While the invention has been shown and described in detail, the foregoing description is in all aspects illustrative and not restrictive. It is therefore understood that numerous modifications and variations can be devised without departing from the scope of the invention.

What is claimed is:

1. A field effect type semiconductor device, comprising:
    a first, field effect type, semiconductor element; and
    a second, field effect type, semiconductor element;
    each of said first and second semiconductor elements having:
        a semiconductor body which is integrally contiguous from said first semiconductor element to said second semiconductor element;
        a gate electrode facing to said semiconductor body with an insulating film therebetween; and
        a pair of main electrodes contacting said semiconductor body across which a main current flows, wherein said main current is larger in said first semiconductor element than in said second semiconductor element,
    said semiconductor body having a first channel region facing at least part of said gate electrode of said first semiconductor element and a second channel region facing at least part of said gate electrode of said second semiconductor element,
    wherein a concentration of an impurity is set higher in said second channel region than in said first channel region so that a gate threshold voltage is larger in said second semiconductor element than in said first semiconductor element,
    whereby a rise of said main current of said second semiconductor element is delayed from a rise of said main current of said first semiconductor element when said device turns on.

2. The field effect type semiconductor device according to claim 1, wherein control means is provided for detecting the main current of said second field effect type semiconductor element and .cutting off said first field effect type semiconductor element when the main current exceeds a predetermined reference value.

3. A field effect type semiconductor device, comprising:
    a first, field effect type, semiconductor element; and
    a second, field effect type, semiconductor element;

each of said first and second semiconductor elements having:
- a semiconductor body which is integrally contiguous from said first semiconductor element to said second semiconductor element;
- a gate electrode facing to said semiconductor body with an insulating film therebetween; and
- a pair of main electrodes contacting said semiconductor body across which a main current flows, wherein said main current is larger in said first semiconductor element than in said second semiconductor element, said semiconductor body having a first channel region facing at least part of said gate electrode of said first semiconductor element and a second channel region facing at least part of said gate electrode of said second semiconductor element,
- wherein both said gate electrode of said first semiconductor element and said gate electrode of said second semiconductor element are substantially formed of semiconductor to which impurity is introduced, and a concentration of said impurity is higher in said gate electrode of said first semiconductor element than in said gate electrode of said second semiconductor element, so that a gate resistance of said second semiconductor element is higher than a gate resistance of said first semiconductor element, and consequently a rise time is larger in said main current of said second semiconductor element than in said main current of said first semiconductor element,
- whereby a rise of said main current of said second semiconductor element is delayed from a rise of said main current of said first semiconductor element when said device turns on.

4. The field effect type semiconductor device according to claim 3, wherein a ratio of the gate resistance of said first field effect type semiconductor element to the gate resistance of said second field effect type semiconductor element is set in the range of 0.5 to 0.9.

5. A field effect type semiconductor device, comprising:
a first, field effect type, semiconductor element; and
a second, field effect type, semiconductor element;
each of said first and second semiconductor elements having:
- a semiconductor body which is integrally contiguous from said first semiconductor element to said second semiconductor element;
- a gate electrode facing to said semiconductor body with an insulating film therebetween; and
- a pair of main electrodes contacting said semiconductor body across which a main current flows, wherein said main current is larger in said first semiconductor element than in said second semiconductor element, said semiconductor body having a first channel region facing at least part of said gate electrode of said first semiconductor element and a second channel region facing at least part of said gate electrode of said second semiconductor element,
- wherein said gate electrode of said second semiconductor element has a portion disposed along an S shaped bending path, so that a gate resistance of said second semiconductor element is higher than a gate resistance of said first semiconductor element, and consequently a rise time is larger in said main current of said semiconductor element than in said main current of said first semiconductor element,
- whereby a rise of said main current of said second semiconductor element is delayed from a rise of said main current of said first semiconductor element when said device turns on.

6. The field effect type semiconductor device according to claim 5, wherein a ratio of the gate input capacitance of said first field effect type semiconductor element to the gate input capacitance of said second field effect type semiconductor element is set in the range of 0.5 to 0.9.

7. A field effect type semiconductor device, comprising:
a first, field effect type, semiconductor element; and
a second, field effect type, semiconductor element;
each of said first and second semiconductor elements having:
- a semiconductor body which is integrally contiguous from said first semiconductor element to said second semiconductor element;
- a gate electrode facing to said semiconductor body with an insulating film therebetween; and
- a pair of main electrodes contacting said semiconductor body across which a main current flows, wherein said main current is larger in said first semiconductor element than in said second semiconductor element, said semiconductor body having a first channel region facing at least part of said gate electrode of said first semiconductor element and a second channel region facing at least part of said gate electrode of said second semiconductor element,
- wherein a channel length of said second channel region is set to be larger than a channel length of said first channel region, so that a gate input capacitance of said second semiconductor element is larger than a gate input capacitance of said first semiconductor element, and consequently a rise time is larger in said main current of said second semiconductor element than in said main current of said first semiconductor element,
- whereby a rise of said main current of said second semiconductor element is delayed from a rise of said main current of said first semiconductor element when said device turns on.

8. The field effect type semiconductor device according to claim 7, wherein a ratio of the channel length of said first field effect type semiconductor element to the channel length of said second field effect type semiconductor element is set in the range of 0.5 to 0.9.

9. A field effect type semiconductor device, comprising:
a first, field effect type, semiconductor element; and
a second, field effect type, semiconductor element;
each of said first and second semiconductor elements having:
- a semiconductor body which is integrally contiguous from said first semiconductor element to said second semiconductor element;
- a gate electrode facing to said semiconductor body with an insulating film therebetween; and
- a pair of main electrodes contacting said semiconductor body across which a main current flows, wherein said main current is larger in said first semiconductor element than in said second semiconductor element, said semiconductor body having a first channel region facing at least part of said gate electrode of said first semiconductor element and a second channel region facing at least part of said gate electrode of said second semiconductor element,
- wherein at least part of said gate insulating film of said first semiconductor element is thicker than said gate insulating film of said second semiconductor element, so that a gate input capacitance of said second semiconductor element is larger than a gate input capacitance of said first semiconductor element, and consequently a rise time is larger in said main current of said second semiconductor element than in said main current of said first semiconductor element, whereby a rise of said main current of said second semiconductor element is delayed from a rise of said main current of said first semiconductor element when said device turns on.

10. The field effect type semiconductor device according to claim 9, wherein a ratio of thickness of the gate insulating film interposed between the gate electrode of said second field effect type semiconductor element and said semiconductor body to thickness of the gate insulating film interposed between the gate electrode of said first field effect type semiconductor element and said semiconductor body is set in the range of 0.5 to 0.9.

* * * * *

UNITED STATES PATENT AND TRADEMARK OFFICE
CERTIFICATE OF CORRECTION

PATENT NO. : 5,729,032  Page 1 of 2
DATED : March 17, 1998
INVENTOR(S) : Yoshifumi Tomomatsu, et al It is certified that error appears in the above-indentified patent and that said Letters Patent is hereby corrected as shown below:

Delete Drawing Figure 17, and subsitute therefor the Drawing Sheet, consisting of Figure 17, as shown on the attached page.

Signed and Sealed this

Sixth Day of October, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,729,032
DATED : March 17, 1998
INVENTOR(S) : Yoshifumi Tomomatsu, et al It is certified that error appears in the above-indentified patent and that said Letters Patent is hereby corrected as shown below:

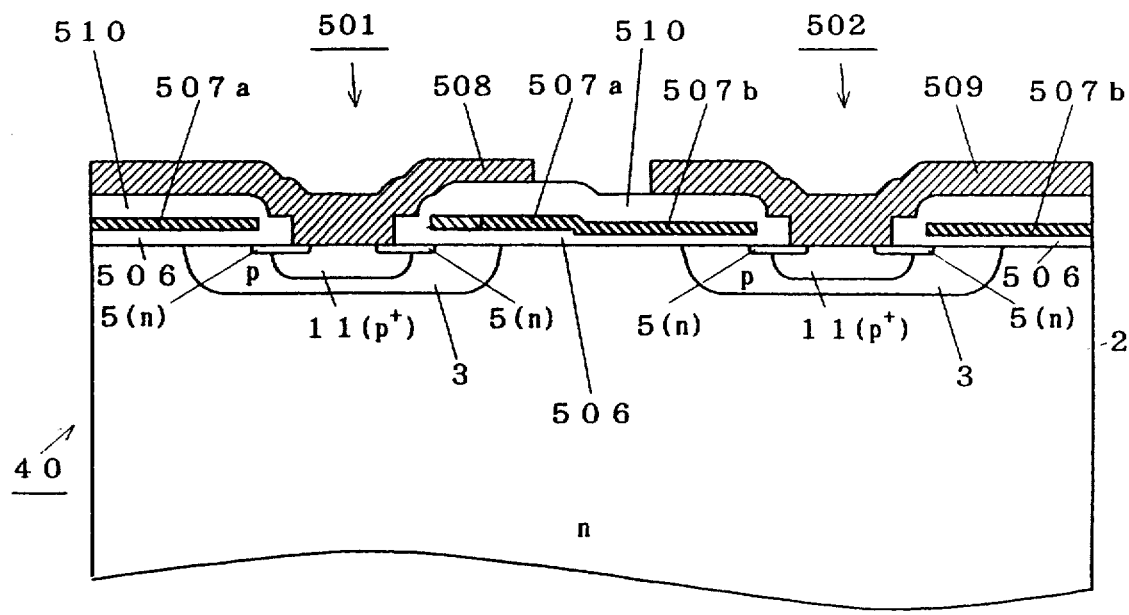

FIG. 17